(12) United States Patent
Bower et al.

(10) Patent No.: US 11,101,417 B2
(45) Date of Patent: *Aug. 24, 2021

(54) STRUCTURES AND METHODS FOR ELECTRICALLY CONNECTING PRINTED COMPONENTS

(71) Applicant: X Display Company Technology Limited, Dublin (IE)

(72) Inventors: Christopher Andrew Bower, Raleigh, NC (US); Matthew Alexander Meitl, Durham, NC (US); Ronald S. Cok, Rochester, NY (US); Salvatore Bonafede, Chapel Hill, NC (US); Brook Raymond, Cary, NC (US); Andrew Tyler Pearson, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 16/532,591

(22) Filed: Aug. 6, 2019

(65) Prior Publication Data

US 2021/0043816 A1  Feb. 11, 2021

(51) Int. Cl.
| | | |
|---|---|---|
| *H01L 33/62* | (2010.01) | |
| *H01L 23/48* | (2006.01) | |
| *H01L 23/498* | (2006.01) | |
| *H01L 23/52* | (2006.01) | |

(52) U.S. Cl.
CPC ............. *H01L 33/62* (2013.01); *H01L 23/48* (2013.01); *H01L 23/49838* (2013.01); *H01L 23/52* (2013.01); *H01L 2224/13013* (2013.01); *H01L 2224/13022* (2013.01);
(Continued)

(58) Field of Classification Search
CPC ... H01L 23/49838; H01L 23/52; H01L 23/48; H01L 33/62; H01L 33/486; H01L 2224/13013; H01L 2224/13022; H01L 2224/13026; H01L 2224/16108
See application file for complete search history.

(56) References Cited

U.S. PATENT DOCUMENTS

| | | |
|---|---|---|
| 6,142,358 A | 11/2000 | Cohn et al. |
| 6,825,559 B2 | 11/2004 | Mishra et al. |
| 6,969,624 B2 | 11/2005 | Iwafuchi et al. |

(Continued)

OTHER PUBLICATIONS

Bower, C. A. et al., Micro-Transfer-Printing: Heterogeneous Integration of Microscale Semiconductor Devises using Elastomer Stamps, IEEE Conference, (2014).
(Continued)

*Primary Examiner* — David A Zarneke
(74) *Attorney, Agent, or Firm* — Choate, Hall & Stewart LLP; William R. Haulbrook; Michael D. Schmitt

(57) ABSTRACT

A printed structure includes a destination substrate comprising two or more contact pads disposed on or in a surface of the destination substrate, a component disposed on the surface, and two or more electrically conductive connection posts. Each of the connection posts extends from a common side of the component. Each of the connection posts is in electrical and physical contact with one of the contact pads. The component is tilted with respect to the surface of the destination substrate. Each of the connection posts has a flat distal surface.

20 Claims, 36 Drawing Sheets

(52) U.S. Cl.
CPC ............... *H01L 2224/13026* (2013.01); *H01L 2224/16108* (2013.01); *H01L 2933/0066* (2013.01)

(56) References Cited

U.S. PATENT DOCUMENTS

| | | |
|---|---|---|
| 7,195,733 B2 | 3/2007 | Rogers et al. |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,309,385 B2 * | 11/2012 | Matsunaga ............... G01P 1/023 438/51 |
| 8,333,860 B1 | 12/2012 | Bibl et al. |
| 8,367,539 B2 * | 2/2013 | Sakurai ............... H01L 23/49811 438/612 |
| 8,470,701 B2 | 6/2013 | Rogers et al. |
| 8,506,867 B2 | 8/2013 | Menard |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,859,335 B2 * | 10/2014 | Lee ............... G02B 6/4227 438/108 |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 8,941,215 B2 | 1/2015 | Hu et al. |
| 8,987,765 B2 | 3/2015 | Bibl et al. |
| 9,048,407 B2 * | 6/2015 | Koyama ............... H01L 24/17 |
| 9,049,797 B2 | 6/2015 | Menard et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,214,410 B2 * | 12/2015 | Kim ............... H01L 24/81 |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,331,042 B2 * | 5/2016 | Sakurai ............... H01L 24/17 |
| 9,355,854 B2 | 5/2016 | Meitl et al. |
| 9,358,775 B2 | 6/2016 | Bower et al. |
| 9,367,094 B2 | 6/2016 | Bibl et al. |
| 9,368,683 B1 | 6/2016 | Meitl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 10,224,231 B2 | 3/2019 | Bower et al. |
| 10,395,966 B2 | 8/2019 | Bower et al. |
| 10,431,487 B2 | 10/2019 | Bower et al. |
| 10,600,671 B2 * | 3/2020 | Bower ............... H01L 33/62 |
| 10,784,177 B2 * | 9/2020 | Sato ............... H01L 24/81 |
| 2002/0096994 A1 | 7/2002 | Iwafuchi et al. |
| 2003/0117369 A1 | 6/2003 | Spitzer et al. |
| 2003/0141570 A1 | 7/2003 | Chen et al. |
| 2005/0110161 A1 * | 5/2005 | Naito ............... H01L 24/75 257/778 |
| 2009/0085052 A1 * | 4/2009 | Ko ............... H01L 33/486 257/98 |
| 2010/0252855 A1 * | 10/2010 | Kamei ............... H01L 24/14 257/99 |
| 2010/0306993 A1 | 12/2010 | Mayyas et al. |
| 2011/0315956 A1 * | 12/2011 | Tischler ............... F21K 9/64 257/13 |
| 2013/0309792 A1 | 11/2013 | Tischler et al. |
| 2013/0316487 A1 | 11/2013 | de Graff et al. |
| 2014/0015072 A1 * | 1/2014 | Kang ............... H01L 25/0657 257/418 |
| 2014/0159043 A1 | 6/2014 | Sakariya et al. |
| 2015/0028362 A1 | 1/2015 | Chan et al. |
| 2016/0093600 A1 | 3/2016 | Bower et al. |
| 2016/0111387 A1 * | 4/2016 | Dang ............... H01L 24/81 257/737 |
| 2017/0338374 A1 | 11/2017 | Zou et al. |
| 2020/0303294 A1 * | 9/2020 | Chang ............... H01L 25/50 |

OTHER PUBLICATIONS

Bower, C. A. et al., Transfer Printing: An Approach for Massively Parallel Assembly of Microscale Devices, IEEE, Electronic Components and Technology Conference, (2008).
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341, (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

* cited by examiner

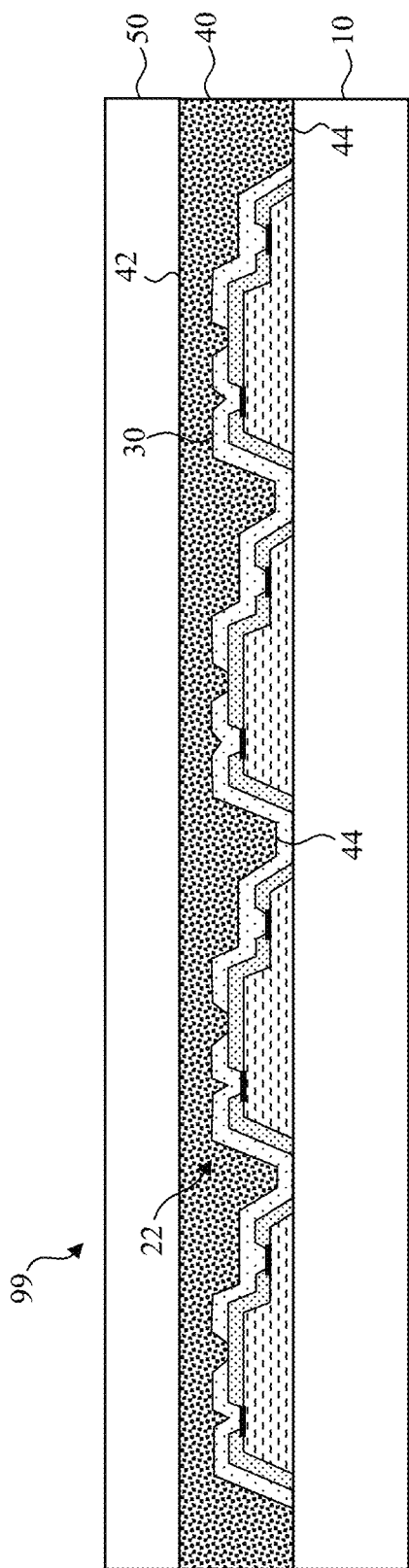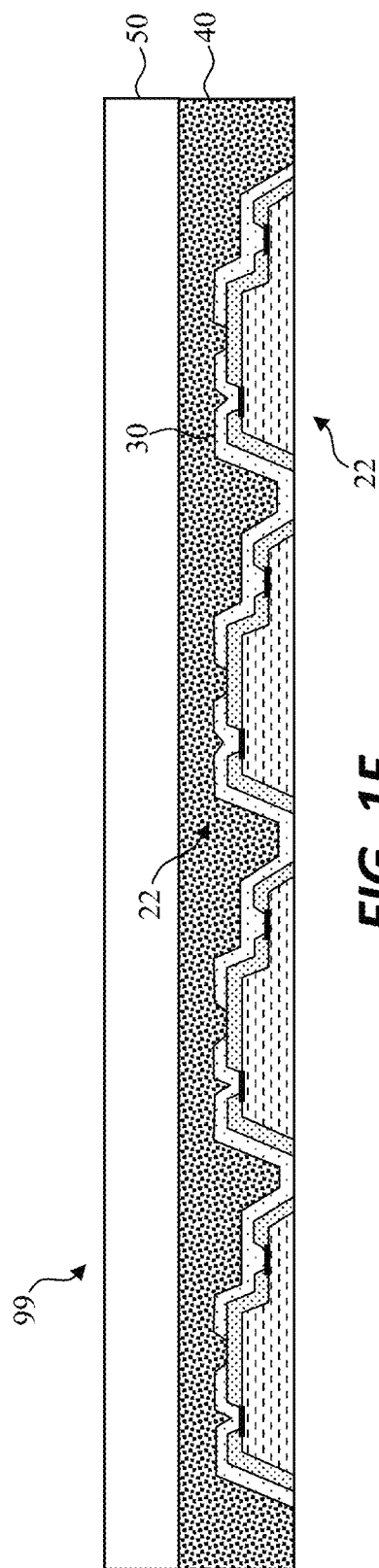

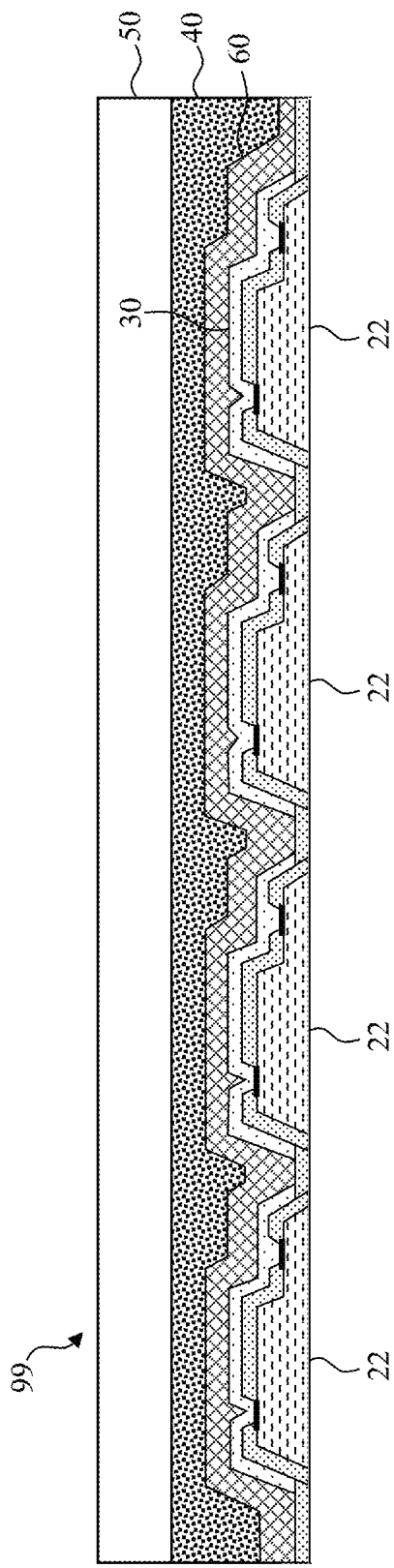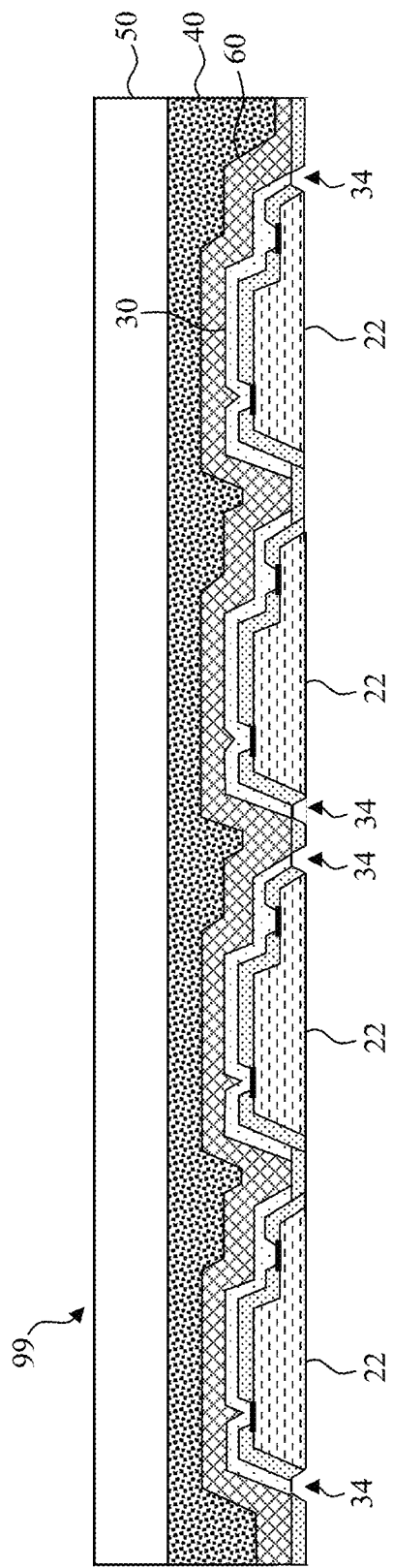

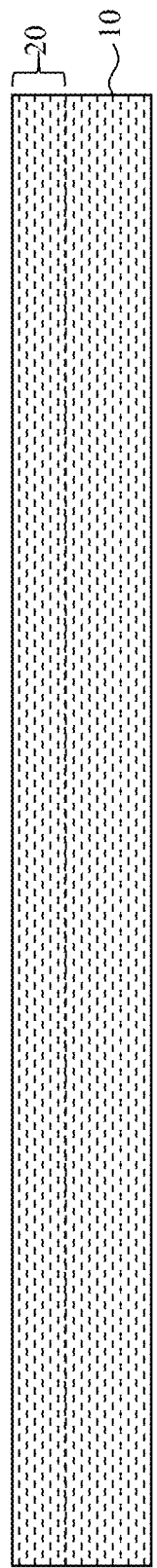
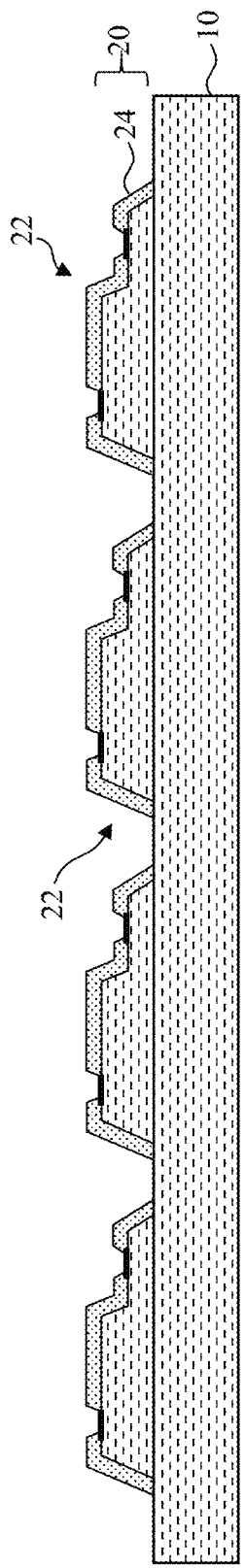
FIG. 3A
FIG. 3B

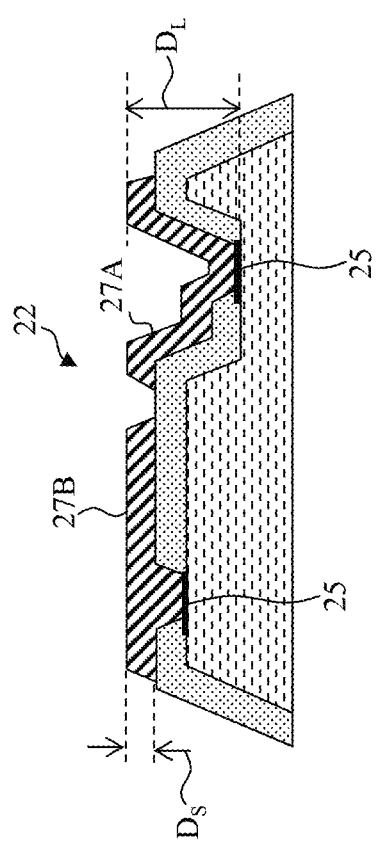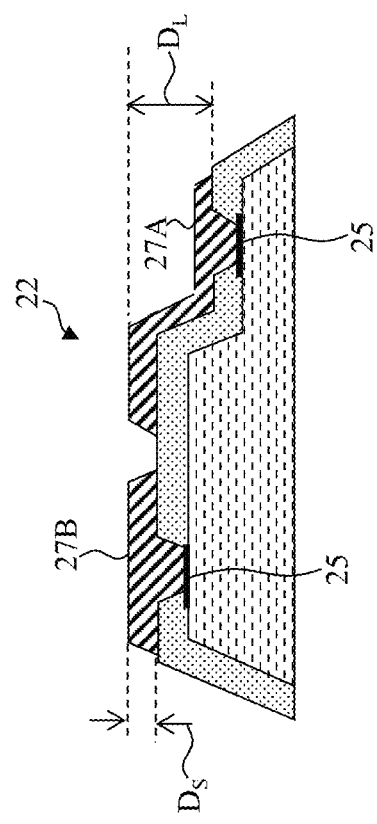

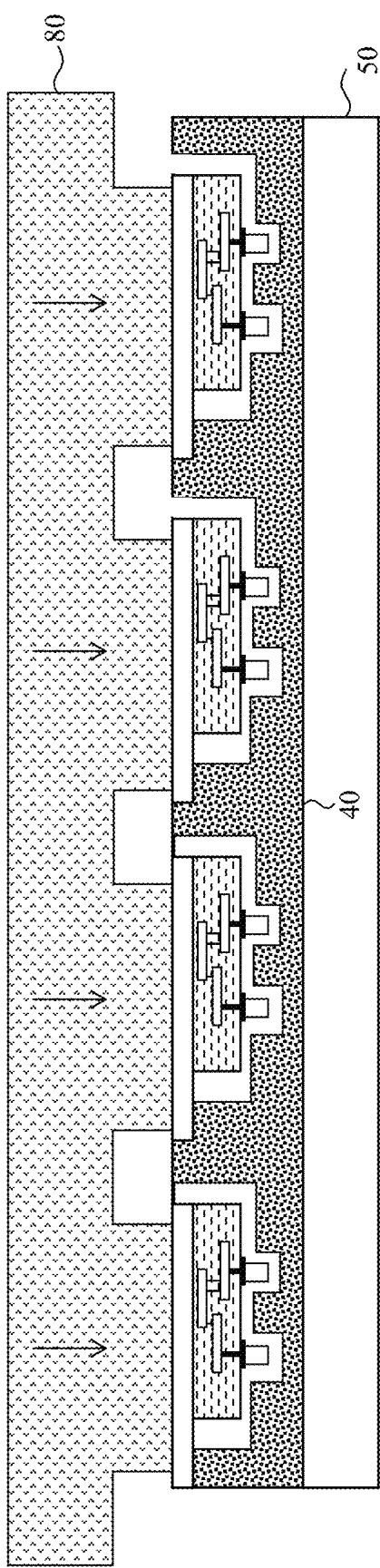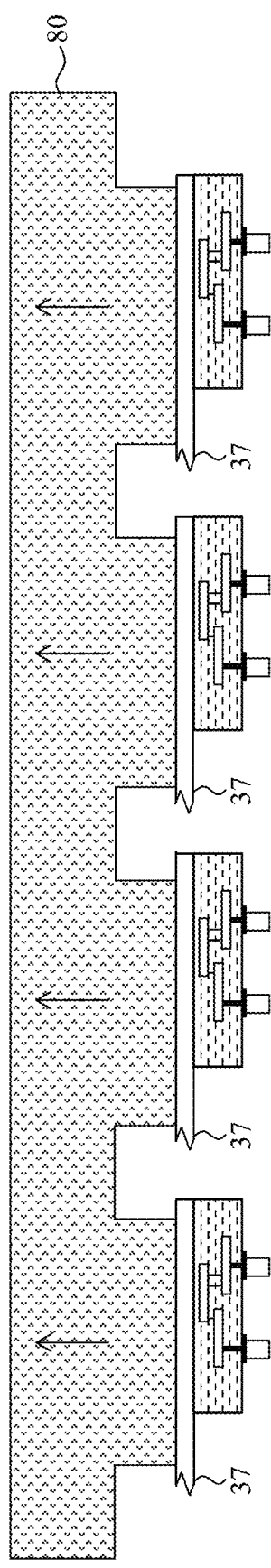

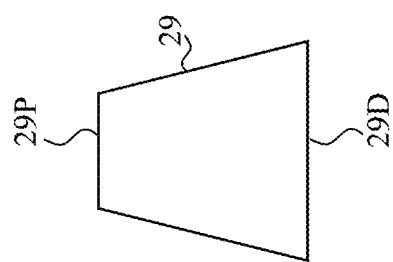
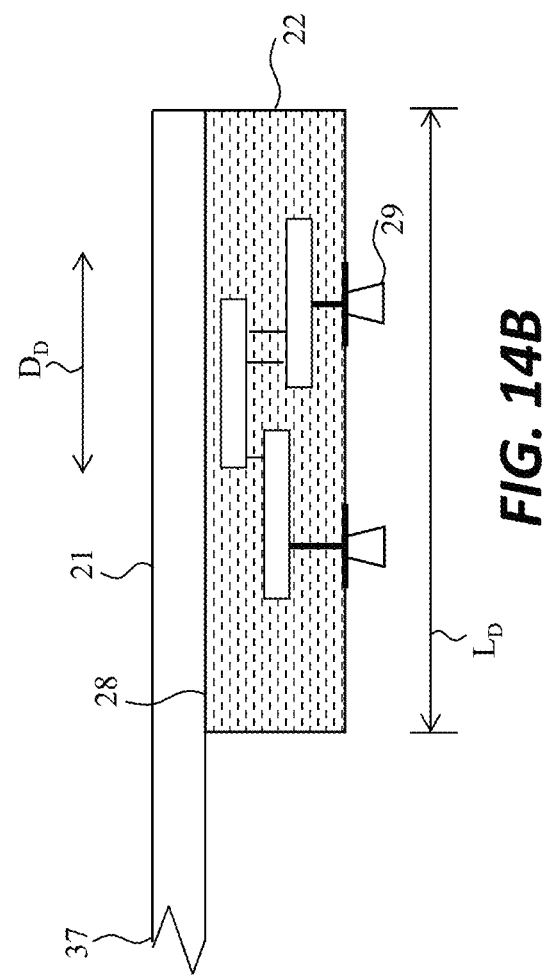
FIG. 14A
FIG. 14B

STRUCTURES AND METHODS FOR ELECTRICALLY CONNECTING PRINTED COMPONENTS

CROSS REFERENCE TO RELATED APPLICATIONS

Reference is made to U.S. Pat. No. 8,889,485, issued Nov. 18, 2014, entitled "Methods for Surface Attachment of Flipped Active Components", to U.S. Pat. No. 9,368,683, issued Jun. 14, 2016, entitled "Printable Inorganic Semiconductor Method", to U.S. Pat. No. 10,224,231 filed Nov. 14, 2017, entitled "Micro-Transfer-Printable Flip-Chip Structures and Methods", to U.S. patent application Ser. No. 16/192,779 filed Nov. 15, 2018, entitled "Micro-Transfer-Printable Flip-Chip Structures and Methods", and to U.S. patent application Ser. No. 15/944,223 filed Apr. 3, 2018, entitled "Micro-Transfer-Printable Flip-Chip Structures and Methods", the contents of each of which are incorporated by reference herein in their entirety.

TECHNICAL FIELD

The present disclosure relates generally to structures and methods for electrically connecting printed components, for example using connection posts that form electrical connections to contact pads during printing.

BACKGROUND

Integrated circuits (ICs) are widely used in electronic devices. Integrated circuits are typically formed on a semiconductor wafer using photolithographic processes and then packaged, for example in a ceramic or plastic package, with pins or bumps on the package providing externally accessible electrical connections to the integrated circuit. An unpackaged integrated circuit is often referred to as a die. Each die typically has electrical contact pads on the top of the integrated circuit that are electrically connected to electronic circuits in the integrated circuit. The die is placed in a cavity in the package, the electrical contact pads are wire-bonded to the package pins or bumps, and the package is sealed. Frequently, multiple identical devices are formed in the semiconductor wafer and the wafer is cut (for example by scribing-and-breaking or by sawing the wafer) into separate integrated circuit dies that are each individually packaged. The packages are then mounted and electrically connected on a printed circuit board to make an electronic system.

In an alternative flip-chip approach, small spheres of solder (solder bumps) are deposited on the integrated circuit contact pads and the integrated circuit is flipped over so that the top side of the die with the solder bumps is located adjacent to the package or other destination substrate. This approach is particularly useful for packages such as pin-grid array packages because they can require less space than a wire-bond process. However, flipping the integrated circuit over can be difficult for very small integrated circuits, for example having a dimension of less than 200, less than 50 microns, less than 20 microns, less than 10 microns, or less than 5 microns. Such small integrated circuit dies are not easily handled without loss or damage using conventional pick-and-place or vacuum tools.

In some applications, the bare integrated circuit dies are not separately packaged but are placed on a destination substrate and electrically connected on the destination substrate, for example using photolithographic or printed-circuit board methods, to form an electronic system. However, as with flip-chip handling, this can be difficult to accomplish when the integrated circuit dies are small. However, an efficient method of transferring bare dies from a relatively small and expensive source substrate (e.g., crystalline semiconductor) to a relatively large and inexpensive destination substrate (e.g., amorphous glass or plastic) is very desirable, since the integrated circuits can provide much higher data processing efficiency than thin-film semiconductor structures formed on large substrates.

In another method, a handle substrate is adhered to the side of the integrated circuits opposite the wafer (the top side), the wafer is removed, for example by grinding, the integrated circuits are adhered to the destination substrate, and the handle substrate is removed. In yet another variation, the handle substrate is the destination substrate and is not removed. In this case, the integrated circuit is flipped over so that the top side of the integrated circuit is adhered to the destination substrate.

In yet another method, epitaxial semiconductor layers are formed on a growth substrate, for example a sapphire substrate. A handle substrate is adhered to the top side of the semiconductor layers opposite the growth substrate, and the growth substrate is removed. The flipped semiconductor layers are then processed to form the integrated circuits. For example, U.S. Pat. No. 6,825,559 describes such a method to make light emitting diodes.

One approach to handling and placing small integrated circuits (e.g., chiplets) uses micro-transfer printing, for example as described in U.S. Pat. Nos. 8,722,458, 7,622,367 and 8,506,867, each of which is hereby incorporated by reference in its entirety. In exemplary embodiments of these methods for printing integrated circuits, an integrated circuit is disposed (e.g., formed) on a source wafer, for example a semiconductor wafer, and undercut by etching a gap between a bottom side of the integrated circuit and the wafer. A stamp contacts a top side of the integrated circuit to adhere the integrated circuit to the stamp, the stamp and integrated circuit are transported to a destination substrate, for example a glass or plastic substrate, the integrated circuit is contacted and adhered to the destination substrate, and the stamp removed to "print" the integrated circuit from the source wafer to the destination substrate. Multiple integrated circuits can be "printed" in a common step with a single stamp. The integrated circuits can then be electrically connected, for example, using conventional photolithographic and printed-circuit board methods. These techniques have the advantage of enabling location of many (e.g., tens of thousands to millions) small integrated circuit devices on a destination substrate in a single print step. For example, U.S. Pat. No. 8,722,458 teaches, inter alia, transferring light-emitting, light-sensing, or light-collecting semiconductor elements from a wafer substrate to a destination substrate using a patterned elastomer stamp whose spatial pattern matches the location of the semiconductor elements on the wafer substrate.

None of the aforementioned flip-chip methods form a flipped integrated circuit that can be micro-transfer printed. Moreover, GaN micro-LEDs are typically formed on sapphire substrates since sapphire has a smaller crystal lattice mismatch with GaN than other materials, such as silicon. Thus, it is desirable to form printable integrated circuit structures, such as micro-LEDs, using a sapphire substrate. However, there is no available method for undercutting a chiplet formed on a sapphire substrate to enable release of the chiplet for micro-transfer printing.

There is a need, therefore, for wafer and integrated circuit structures and methods that provide flipped micro-transfer printable integrated circuits and for structures and methods that enable the construction of micro-LED chiplets formed on a sapphire substrate that can be micro-transfer printed. There is also a need for simple and inexpensive methods and structures having a reduced area that enable electrical interconnections for chiplets printed on destination substrates. Furthermore, there is a need for methods and structures that enable electrically connecting the electrical contacts of printed structures, such as printed LEDs, using fewer processing steps than conventional methods.

SUMMARY

The present disclosure provides structures and methods for electrically connecting components (e.g., semiconductor devices) that are printed onto destination substrates. While post-printing photolithographic patterning of conductors can be used, it adds complexity to the fabrication process. Electrically conductive connection posts that extend from a surface of a component can be used to form electrical connections between contact pads disposed on or in a destination substrate during printing, thereby alleviating the need for post printing processing. In order to form good electrical connection between connection posts (and therefore a component) and contact pads on or in a destination substrate, connection posts can be sharp. In this way, the connection posts can, for example, pierce and/or embed into contact pads to form good electrical connections. However, the present disclosure encompasses the recognition that forming sufficiently sharp (pointed) connection posts is difficult and/or costly in certain applications. For example, making sharp (pointed) connection posts may require additional processing steps, thereby adding cost. The present disclosure further recognizes that components with connection posts with a flat distal surface (at a distal end) can have improved electrical connection to contact pads on or in a destination substrate when the component is printed to have a tilt (e.g., an angle). Doing so allows one or more edges, or portions thereof, of the connection posts to, for example, pierce or embed contact pads, thereby providing the improved electrical connection. As described further herein, a component can be printed at a tilt by, for example, including connection posts that are different heights or extend from different surfaces disposed in different planes with respect to the component. Accordingly, by using components with connection posts with flat distal surfaces printed at a tilt, connection post fabrication can be simplified while providing good electrical connection.

In some aspects, the present disclosure is directed to a printed semiconductor structure comprising a destination substrate comprising two or more contact pads disposed on a surface of the destination substrate, a completed semiconductor device disposed on the surface, the completed semiconductor device comprising two or more electrical contacts disposed on a common side of the completed semiconductor device, and two or more connection posts, each of the connection posts (i) extending from the completed semiconductor device, (ii) electrically connected to at least one of the electrical contacts, and (iii) in electrical contact with at least one of the contact pads. The completed semiconductor device is tilted (e.g., angled) with respect to the surface of the destination substrate and at least one connection post has a flat distal surface.

In some embodiments, the at least one connection post has an edge that is in electrical contact with the contact pad. In some embodiments, the distal surface has a greater area than the proximal surface. The distal surface can have a post length greater than a post width; the completed semiconductor device can have a device length greater than a device width, and a direction of the device length can be orthogonal to a direction of the post length. The connection posts can have different heights. In some embodiments, the electrical contacts are in different planes with respect to the completed semiconductor device or a surface of a destination substrate on which the completed semiconductor device is disposed, and the connection posts have a common height.

In some embodiments, the completed semiconductor device comprises a substantially planar side opposite the common side and the substantially planar side is tilted or at an angle with and is not parallel to the surface of the destination substrate. The substantially planar side (e.g., a surface) can be on a side of the completed semiconductor device opposite a surface of a destination substrate on which the completed semiconductor device is disposed.

The printed semiconductor structure can comprise a broken or separated tether. The connection posts (i) can be tapered, (ii) can have a height-to-width aspect ratio of greater than 1:1, or both (i) and (ii). The completed semiconductor device can have at least one of a width, a length, and a height from 2 to 100 μm (e.g., 2 to 5 μm, 5 to 10 μm, 10 to 20 μm, 20 to 50 μm, or 50 to 100 μm).

According to some embodiments of the present disclosure, a printed semiconductor structure comprises a plurality of completed semiconductor devices disposed on the surface, wherein each completed semiconductor device of the plurality of semiconductor devices (i) is tilted (e.g., angled) with respect to the surface, and (ii) comprises two or more electrical contacts disposed on a common side of the completed semiconductor device. A connection post extends from each completed semiconductor device, wherein each connection post is in electrical contact with a contact pad and at least one connection post has a flat distal surface.

According to some embodiments, at least one of the connection posts extends from an electrical contact of the two or more electrical contacts. According to some embodiments, the completed semiconductor device comprises an electrically separate electrode electrically connected to at least one of the electrical contacts and at least one of the connection posts extends from the electrode.

According to some embodiments of the present disclosure, a semiconductor structure comprises a completed semiconductor device comprising two or more electrical contacts disposed on a common side of the semiconductor device and two or more connection posts, each connection post (i) extending from the completed semiconductor device, (ii) electrically connected to an electrical contact, and (iii) at least one connection post has a flat distal surface. The distal surface has a post length greater than a post width; the completed semiconductor device has a device length greater than a device width, and a direction of the device length is orthogonal to a direction of the post length.

According to some embodiments, the one of the contact pads comprises a contact pad post and each of the connection posts contacts the contact pad post of the one of the contact pads substantially at a point.

The completed semiconductor device can comprise a broken or separated tether, the connection posts can have different heights, and the electrical contacts can be in different planes and the connection posts can have a common height.

The distal surface can have a greater area than the proximal surface.

The completed semiconductor device can be a light-emitting device, a light-emitting diode, a laser, or a laser diode. The completed semiconductor device can have at least one of a width, a length, and a height from 2 to 100 μm (e.g., 2 to 5 μm, 5 to 10 μm, 10 to 20 μm, 20 to 50 μm, or 50 to 100 μm).

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A-1J are successive cross sections illustrating (i) sequential steps in an exemplary method and (ii) a semiconductor structure, according to illustrative embodiments of the present disclosure;

FIGS. 2A-2K are successive cross sections illustrating sequential steps in another exemplary method and (ii) another semiconductor structure, according to illustrative embodiments of the present disclosure;

FIGS. 3A-3B are successive cross sections illustrating sequential steps in an exemplary method, according to illustrative embodiments of the present disclosure;

FIGS. 6A-6F are cross sections illustrating a variety of completed semiconductor devices with a corresponding variety of connection post structures, according to illustrative embodiments of the present disclosure;

FIG. 14A is a vertical cross section of an inverted trapezoidal connection posts and FIG. 14B is a cross section of a component with inverted trapezoidal connection posts according to illustrative embodiments of the present disclosure;

Figure 1A:
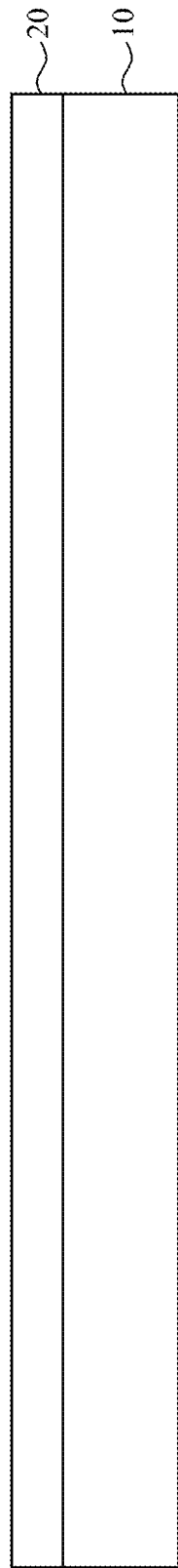

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, structures and methods to enable micro-transfer printing from devices formed on a sapphire substrate. The present disclosure also provides, inter alia, structures and methods to enable micro-transfer printing of flipped integrated circuits adhered to a handle substrate. By forming completed semiconductor devices before the removal of a support or growth substrate, photolithographic processing steps that would otherwise disable or destroy release layers and structures needed for transfer printing (e.g., micro-transfer printing) are performed before the construction of the release layer. Thus, once a support or growth substrate is removed, a release layer can be etched and completed semiconductor devices can be transfer printed (e.g., micro-transfer printed) without exposing the completed semiconductor device or release layer to destructive photolithographic process steps. Completed semiconductor devices are otherwise functional devices that do not necessarily include the electrical conductors necessary for providing electrical power to the completed semiconductor devices.

Figure 1B:
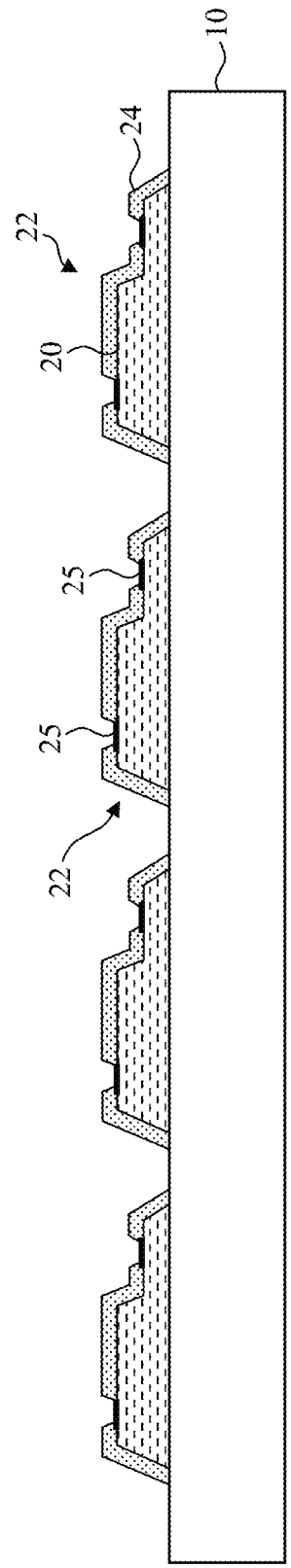

According to some embodiments of the present disclosure, and referring to FIGS. 1A-1J and FIG. 9, an exemplary method of making a semiconductor structure 99 (FIGS. 1E-1G) suitable for micro-transfer printing includes providing a support substrate 10 in step 100 and forming a completed semiconductor device 22 (i.e., in this exemplary method by disposing one or more semiconductor layers 20 in, on, or over the support substrate 10) in step 105 (as shown in FIG. 1A). A completed semiconductor device 22 can be formed by disposing one or more layers or substructures on a support substrate 10. The one or more semiconductor layers 20 can optionally be processed in step 110 to make completed semiconductor devices 22 (as shown in FIG. 1B). The processing can include, for example, patterning materials, adding other materials, and forming structures.

In some embodiments, a support substrate 10 comprises at least one of glass, plastic, semiconductor, compound semiconductor, sapphire (e.g., aluminum oxide or $Al_2O_3$), ceramic, quartz, silicon, GaAs, GaN, InP, SiC, GaP, GaSb, AN, an MgO. A support substrate 10 can be a different other substrate suitable for photolithographic processing. A support substrate 10 can be substantially transparent, for example 50%, 70%, or 90% transparent to at least one of visible, UV, and IR electromagnetic radiation. A support substrate 10 can include multiple layers, can include one or more semiconductor layers 20, can be a growth substrate, or can include a growth or semiconductor seed layer on which the one or more semiconductor layers 20 are formed or disposed. A support substrate 10 can be crystalline or have a crystalline layer.

One or more semiconductor layers 20 can be organic or inorganic, can be crystalline, can be a semiconductor, can be a compound semiconductor, can be doped (e.g., implanted), for example with p or n doping to provide desired electrical structures and functions, or any combination thereof. A semiconductor layer in the one or more semiconductor layer 20 in a completed semiconductor device 22 can include one or more of GaN, Si, InP, SiGe, and GaAs. Each of the one or more semiconductor layers 20 can be formed or disposed in step 105 using photolithographic processes including, for example, evaporation or sputtering. In some embodiments, at least one of the one or more semiconductor layers 20 is formed or disposed using a chemical vapor deposition, molecular/atomic layer deposition, physical vapor deposition, pulsed laser deposition or epitaxy method. In some embodiments, a support substrate 10 is a semiconductor substrate and disposing one or more semiconductor layers 20 in, on, or over the support substrate 10 (step 105) includes doping (e.g., implanting) a portion or layer of a semiconductor substrate (e.g., support substrate 10) to form the one or more semiconductor layers 20. In some embodiments, disposing one or more semiconductor layers 20 in, on, or over a support substrate 10 (step 105) includes growing the one or more semiconductor layers 20 on the support substrate 10 or on a growth layer on the support substrate 10, for example using epitaxial techniques. In these embodiments, the support substrate 10 can be, but is not necessarily, a crystalline semiconductor substrate or sapphire substrate. In some embodiments, a support substrate 10 is a sapphire substrate. In some embodiments, a support substrate 10 is a crystalline semiconductor substrate.

The one or more semiconductor layers 20 can be optionally processed in step 110 using photolithographic methods, including, for example, evaporation, sputtering, CVD, annealing, or masking using photoresist, exposure to patterned radiation, and etching. One or more semiconductor layers 20 can be patterned and structured and additional layers and structures can be formed on or in the one or more semiconductor layers 20, for example, patterned dielectric layers 24 or patterned conductors such as electrical contacts 25 formed, as shown in FIG. 1B. Electrical contacts 25 can be a metalized portion of one or more of the semiconductor layers 20 or a patterned metal layer over one or more of the semiconductor layers 20 (e.g., with Ag, Al, Ni, Ti, Au, Pd, W, or metal alloys) or simply a designated portion of one or more of the semiconductor layers 20 (e.g., designated for forming electrical connections) and are, in any case, portions of the completed semiconductor device 22 to which electrical connections can be made and power and signals provided to operate the completed semiconductor device 22. In some embodiments, a completed semiconductor device 22 is formed of one or more semiconductor layers 20 and any additional layers and structures necessary to function as intended. In some embodiments, a completed semiconductor device 22 comprises a dielectric layer 24 (e.g., a patterned dielectric layer). A plurality of completed semiconductor devices 22 can be disposed on the support substrate 10 (as shown in FIG. 1B, for example).

In some embodiments, a completed semiconductor device 22 includes all of the elements necessary to function but does not necessarily include electrical connections to external power or signal sources that enable device operation, or necessarily include protective layers. FIG. 1B illustrates a horizontal LED structure with shaped, structured, and doped (e.g., implanted) semiconductor layers 20, a patterned dielectric layer 24 that defines vias, and two electrical contacts 25 through which electrical power can be transmitted to the semiconductor layers 20 to cause the completed semiconductor device 22 to operate. In FIG. 1B, the completed semiconductor device 22 results all of the photolithographic steps, such as processing and patterning steps, to make the completed semiconductor device 22 functional. A functional completed semiconductor device 22 is a device that provides a desired electronic, optical, thermal, mechanical, magnetic, electric field, photonic, or opto-electronic effect when provided with power but does not include the interconnections necessary to provide power or control signals, such as electrical power or control signals (e.g., from a controller).

Figure 1C:
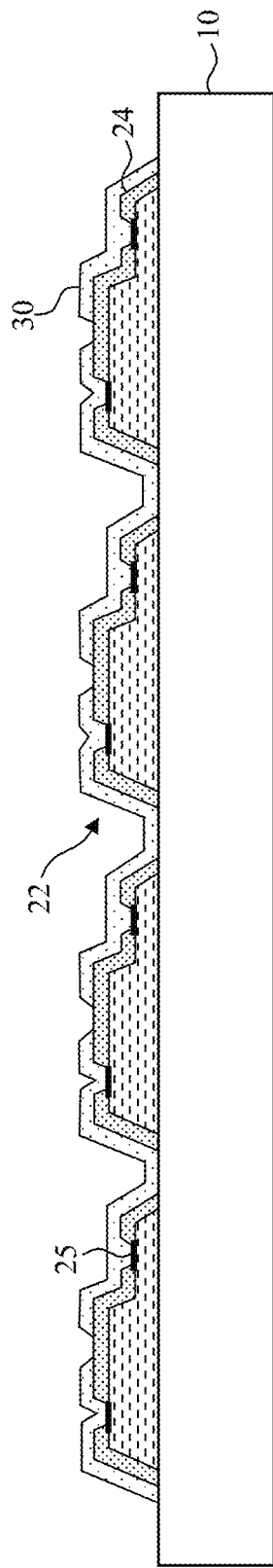

Referring next to FIG. 1C, a patterned release layer 30 is formed or disposed on or over the completed semiconductor device 22 and optionally at least partly in contact with the support substrate 10 (as shown) in step 115. In some embodiments, a patterned release layer 30 does not contact a support substrate 10. A patterned release layer 30 can be formed or disposed using photolithographic methods and materials and can include germanium, Si, TiW, Al, Ti, a lift-off resist, or other polymers. In some embodiments, a patterned release layer 30 material can etch in developer, is not photo-active, or can etch at a higher temperature than photo-active materials such as photo-resists (e.g., greater than 200° C., 300° C., or 400° C.). In some embodiments, a patterned release layer 30 forms a gap 32 or space, for example, after etching the patterned release layer 30 material. For example, a gap can be formed between a completed semiconductor device 22 and a bonding layer 40 after the patterned release layer 30 has been removed.

Figure 1D:
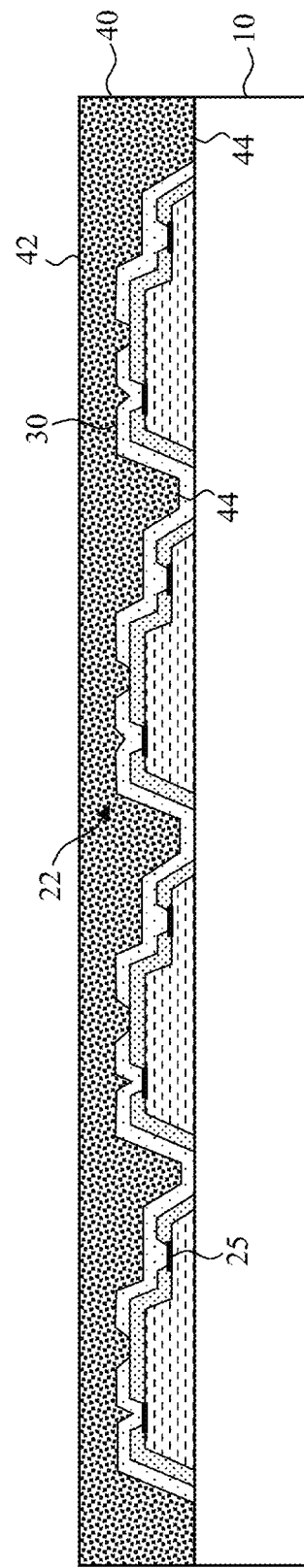

Referring to FIGS. 1D and 1E, a handle substrate 50 is provided in step 125, for example, a glass substrate or a plastic substrate. A conformable and curable bonding layer 40 is disposed on the patterned release layer 30 (as shown in FIG. 1D) or on the handle substrate 50 (or on an optional capping layer, discussed further subsequently with respect to FIG. 2C) in step 130. When a conformable and curable bonding layer 40 is disposed on a patterned release layer 30, a portion may also be disposed on a support substrate 10 (as shown in FIG. 1D). A conformable and curable bonding layer 40 can have a substantially planar side 42 opposite a non-planar side 44 closer to a completed semiconductor device 22. A handle substrate 50 can be substantially transparent, for example 50%, 70%, or 90% transparent to at least one of visible, UV, and IR electromagnetic radiation. A bonding layer 40 can be, for example, a curable resin, epoxy, SU-8, a metal layer, a metal alloy layer, a solder layer, or AuSn. The handle substrate 50 is located in contact with the bonding layer 40 and bonded to the completed semiconductor devices 22, for example, by curing the bonding layer 40 in step 135 (as shown in FIG. 1E) by providing heat, by cooling, or by providing electromagnetic radiation (e.g., UV light) to the bonding layer 40, for example through the handle substrate 50. Curing a bonding layer 40 can include forming a chemical reaction in a material of the bonding layer 40 or hardening the bonding layer 40, or by facilitating a phase change from a liquid to a solid (as with a solder). A bonding layer 40 can be cured by exposing the bonding layer 40 material to light or heat (for example if the bonding layer 40 is a UV-curable resin) or by exposing the bonding layer 40 to heat to melt a metal or metal alloy, disposing a structure in contact with the melted metal or metal alloy, and then cooling the metal. Thus, in some embodiments of the present disclosure, a metal or metal alloy bonding layer 40 is deposited, heated to melt the metal bonding layer 40 to a liquid, a handle substrate 50, a capping layer 60, or a release layer 30 is brought into contact with the melted liquid metal bonding layer 40, and the melted metal bonding layer 40 is cooled to a solid to adhere the bonding layer 40 to the handle substrate 50, capping layer 60, or release layer 30.

Referring to FIG. 1F, the support substrate 10 is removed to expose the completed semiconductor device 22 and optionally expose a portion of the patterned release layer 30 to the local environment (as shown) in step 140. In some embodiments, removing a support substrate 10 to expose a completed semiconductor device 22 comprises removing one or more additional layers (e.g., dielectric layers, spacing layers, adhesion layers, growth layers, or removal layers) disposed between the support substrate 10 and the completed semiconductor device 22. If at least a portion of the patterned release layer 30 is not exposed, an entry path 34 is formed to expose a portion of the patterned release layer 30 (as shown in FIG. 2H and discussed further subsequently) in step 145. For example, a portion of a layer that partially covers a patterned release layer 30 can be removed to form an entry path 34. A support substrate 10 can be removed, for example, by one or more of laser liftoff, ablation, laser ablation, etching, and grinding. In some embodiments, both grinding and another removal technique, such as etching, are used.

Figure 1G:
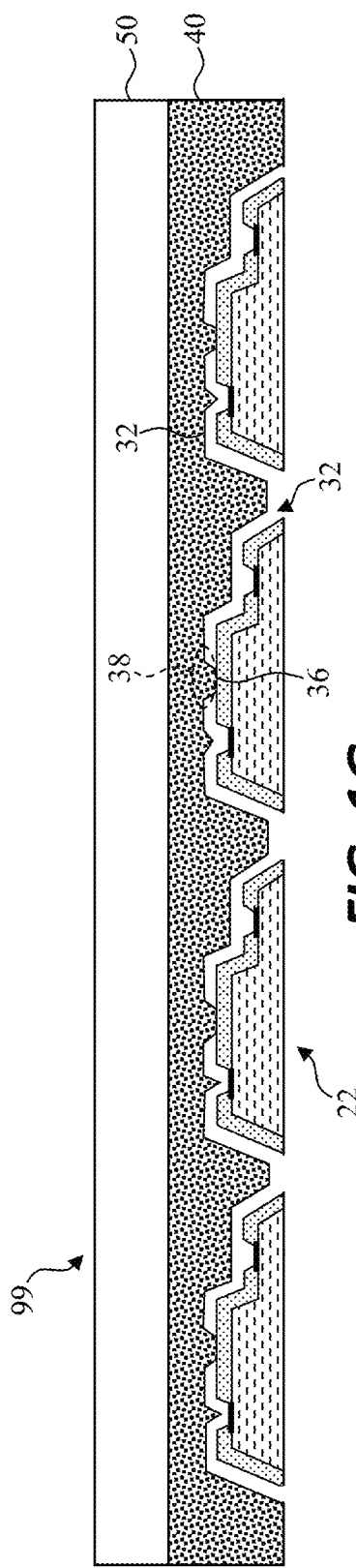

As shown in FIG. 1G, the release layer 30 is removed in step 150, for example by etching with $H_2O_2$, $XeF_2$, HCl, HF, trimethylammonium hydroxide (TMAH), or oxygen plasma. The selection of etchant can depend on the material of the patterned release layer 30. For example, $H_2O_2$ or $XeF_2$ can be used with a Ge, W, or TiW release layer 30, $XeF_2$ can be used with a Si release layer 30, HCl acid mixtures can be used with an Al or Ti release layer 30, TMAH-based developers can be used with a lift-off resist release layer 30, and oxygen plasma can be used with polyimide, epoxy, PMMA, or other organic release layers 30. In some embodiments, an etchant is benign to materials found in or exposed on the surface of a completed semiconductor device 22, a bonding layer 40, or both. After etching, a patterned release layer 30 forms a gap 32 or space between a completed semiconductor devices 22 and a bonding layer 40. Referring to FIG. 1G, the release layer 30 is patterned so that a tether 36 physically connects the completed semiconductor devices 22 to an anchor 38 portion of the bonding layer 40 and holds the completed semiconductor devices 22 in place. Generally, an anchor 38 can be a portion of a handle substrate 50 or a layer disposed on the handle substrate (e.g., between the handle substrate 50 and a completed semiconductor device 22), such as, for example, a bonding layer, a capping layer (not shown in FIG. 1G), or a dielectric layer 24. In the illustrative embodiment illustrated in FIG. 1G, the tether 36 is an interface to a post forming the anchor 38. In this embodiment, the anchor 38 is a portion of the bonding layer 40. The interface can, for example, provide a weak adhesion, for example adhesion provided by van der Waal's forces, and can be an interface with or of metal such as gold, tin, or a solder disposed on a portion of the completed semiconductor device 22.

Figure 1H:
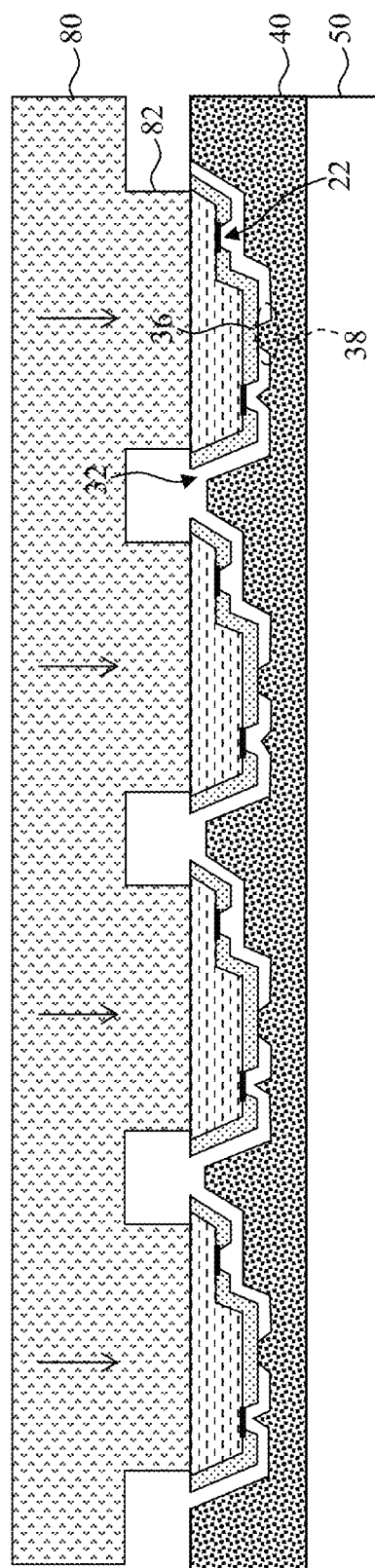
Figure 1I:
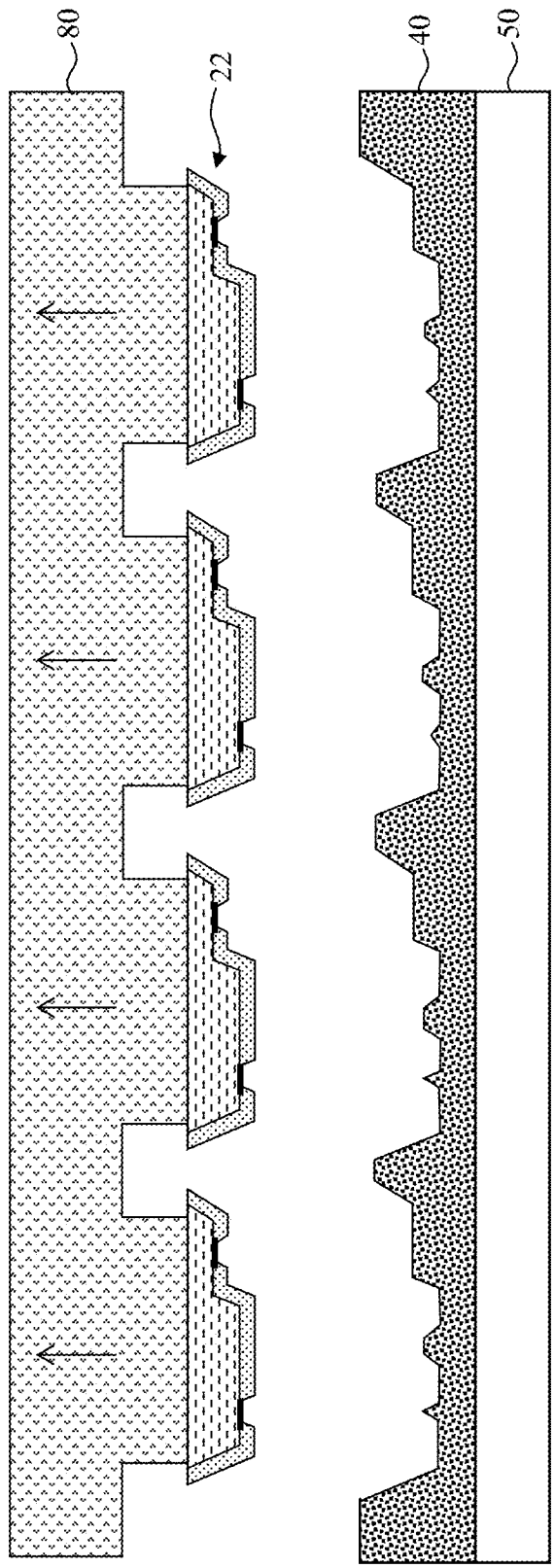
Figure 1J:
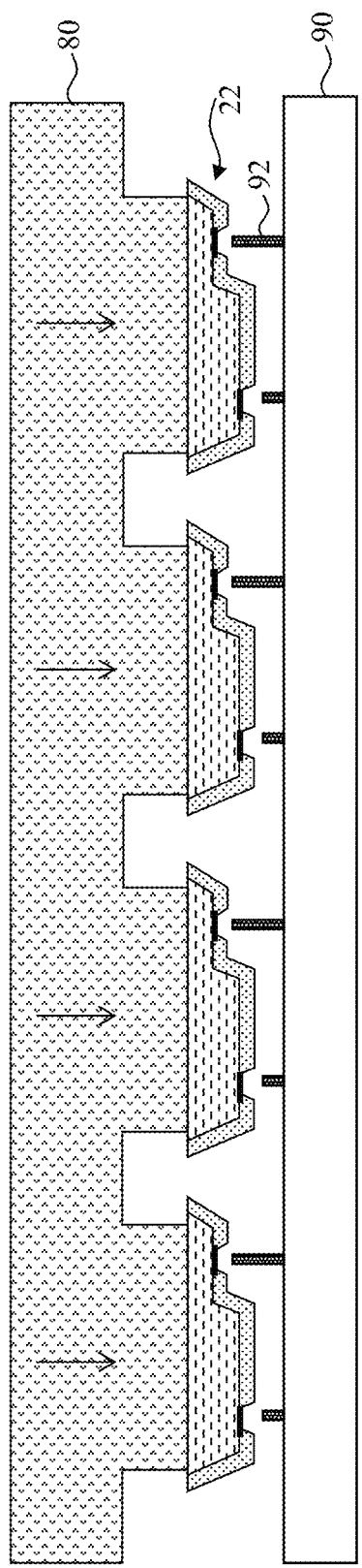

Once the release layer 30 is etched, the completed semiconductor devices 22 can be micro-transfer printed in step 160, as illustrated in FIG. 1H (shown with an inverted orientation from FIG. 1G), with a stamp 80 (e.g., an elastomeric stamp, for example comprising PDMS) comprising stamp pillars 82 that press against and adhere to the completed semiconductor devices 22 and is then separated from the handle substrate 50 (as shown in FIG. 1I). Referring to FIG. 1J, the completed semiconductor devices 22 are brought into aligned contact with a destination substrate 90 (the destination substrate 90 is provided in step 155) and adhered to the destination substrate 90. In some embodiments, electrical contacts 25 of a completed semiconductor device 22 are electrically connected to contact pads 92 formed or disposed on a destination substrate 90. Contact pads 92 can be electrically connected to an electrical circuit, for example through electrical conductors on the destination substrate 90 (not shown), to provide electrical power and signals to a completed semiconductor device 22.

Figure 2A:
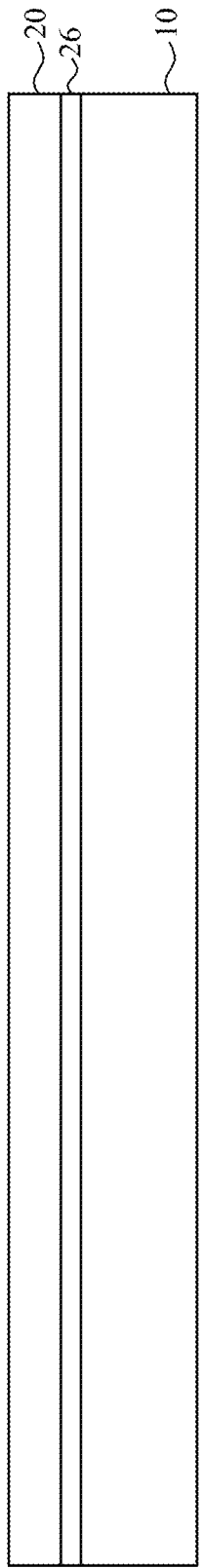
Figure 2B:
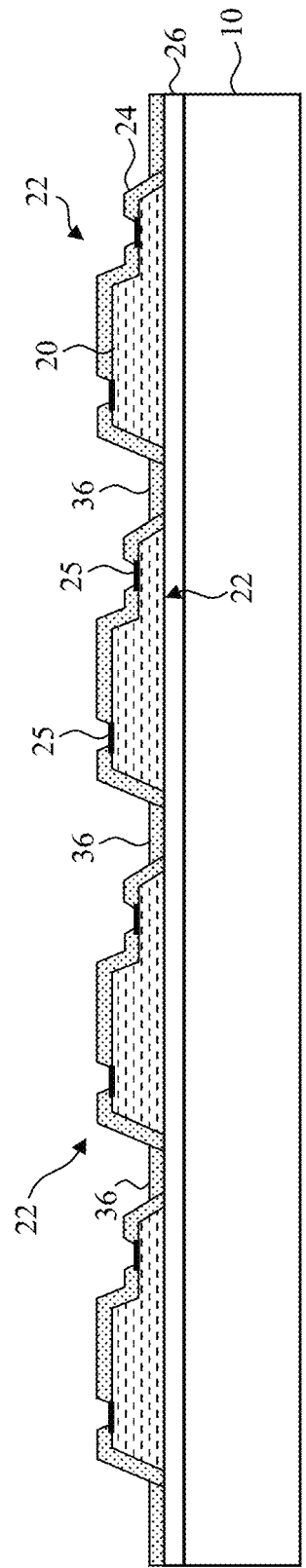
Figure 2C:
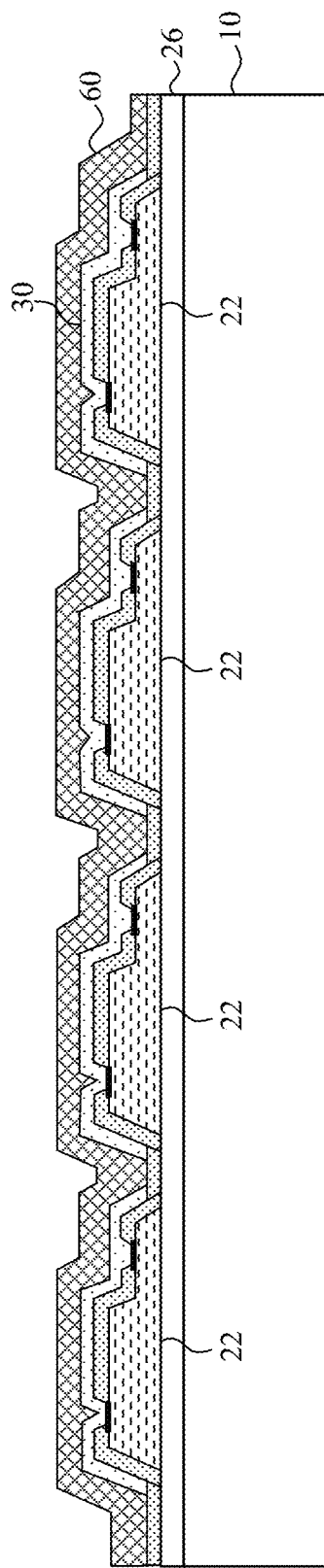
Figure 2D:
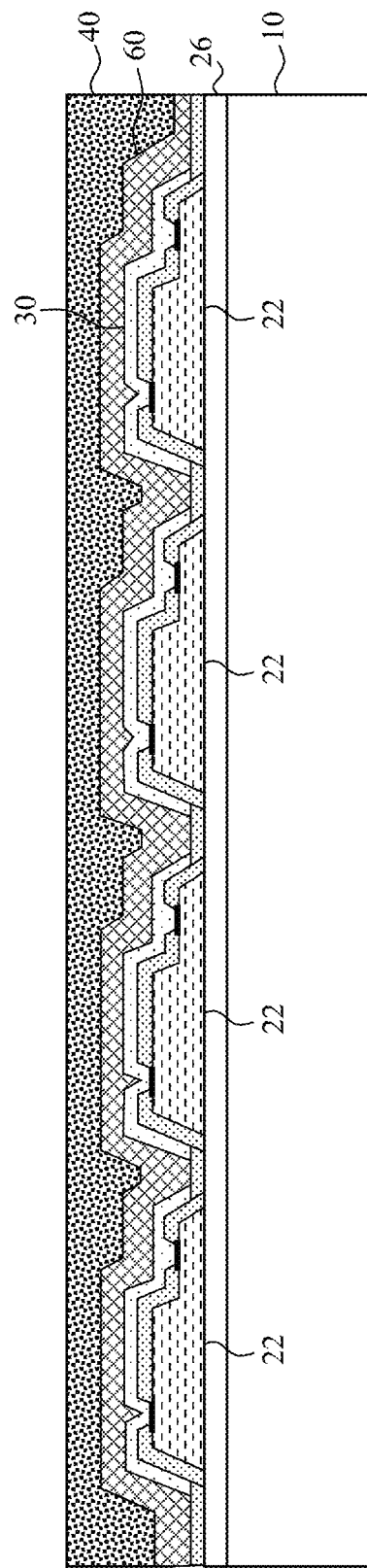
Figure 2E:
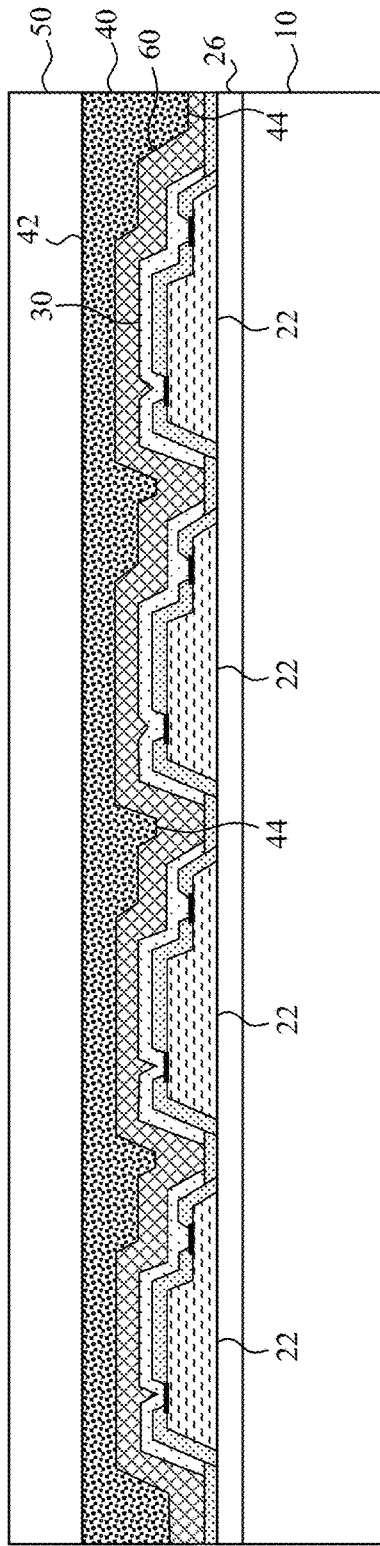
Figure 2F:
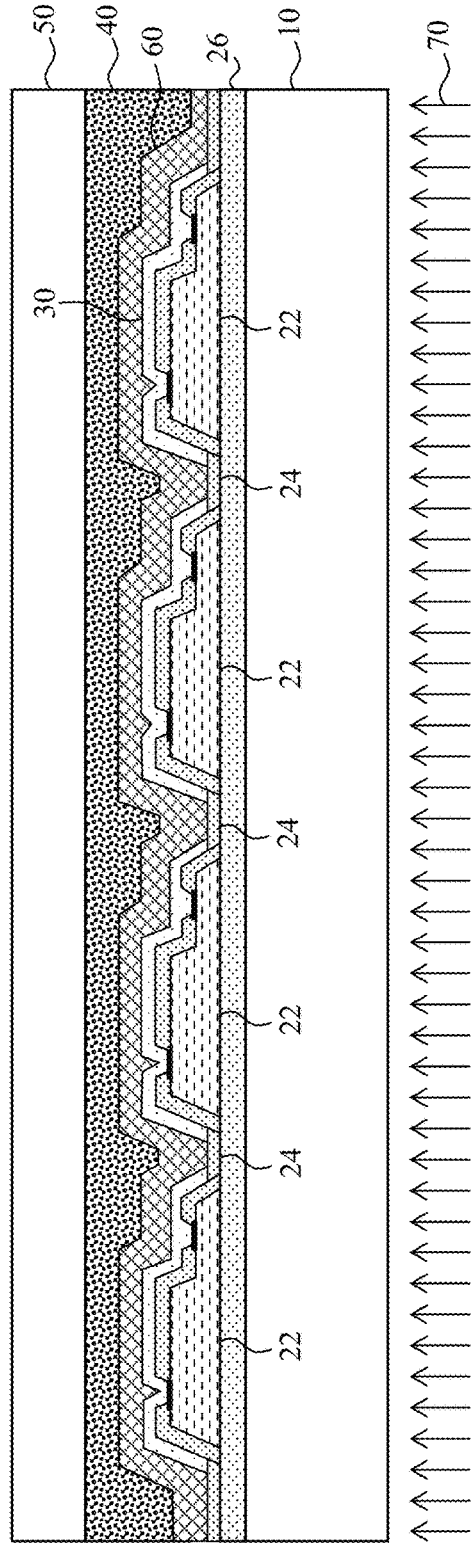
Figure 2I:
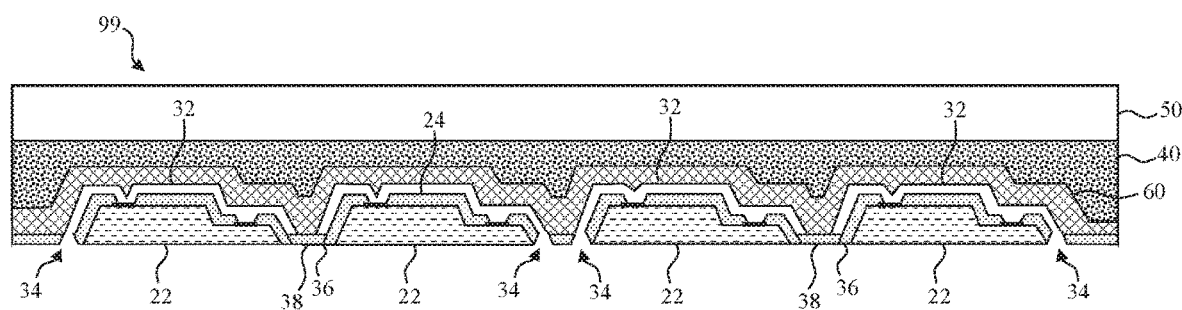

In some embodiments of the present disclosure, and referring to FIGS. 2A-2K, an alternative exemplary method of making a semiconductor structure 99 (as shown in FIG. 2G-2I) suitable for micro-transfer printing includes additional steps and elements as compared to the process and semiconductor structure 99 described with respect to FIGS. 1A-1J. Referring to FIG. 2A and again to FIG. 9, a support substrate 10 is provided in step 100 that includes a removal layer 26. A removal layer 26 can be an ablation layer or an etch-stop layer and can be a layer of a support substrate 10 or a layer disposed on the support substrate 10. A removal layer 26 can be patterned. Ablation and etch-stop layers can include one or more of (i) $SiO_x$ or $SiN_x$ deposited by, for example, plasma-enhanced chemical vapor deposition (PECVD) and (ii) organic layers with or without particles. Additional layers, such as buffer layers (e.g., C—GaN, AlGaN, or doped GaN) or one or more semiconductor growth layers can be provided as well.

A completed semiconductor device 22 (i.e., in this exemplary method by disposing one or more semiconductor layers 20 in, on, or over the support substrate 10) in step 105 (as shown in FIG. 2A). A completed semiconductor device 22 can be formed by disposing one or more layers or substructures on a support substrate 10. The one or more semiconductor layers 20 can be processed in step 110 to form the completed semiconductor device 22 (as shown in FIG. 2B) over or in contact with the removal layer 26, as described previously. In some embodiments, and as is shown in FIG. 2B, a dielectric layer 24 of a completed semiconductor device 22 is patterned to extend beyond the completed semiconductor device 22 (e.g., for use in forming anchors 38 and/or tethers 36).

Referring next to FIG. 2C, a patterned release layer 30 is formed or disposed on or over the completed semiconductor device 22 in step 115. As shown in FIG. 2C, a patterned release layer 30 can be at least partially in contact with a dielectric layer 24 rather than a support substrate 10 (in contrast to what is shown in FIG. 1C). In some embodiments (not shown), a patterned release layer 30 is at least partially in contact with a removal layer 26. Referring to FIG. 2C, a capping layer 60 is disposed on the release layer 30 in step 120. A capping layer 60 is optional and is not present in some embodiments. A capping layer 60 can be deposited using photolithographic methods such as evaporation, sputtering, plating, atomic layer deposition (ALD), or coating and can include organic or inorganic materials such as $SiN_x$, $SiO_x$, copper, nickel, or other materials. A capping layer 60 can be non-planar, patterned, structured or shaped, can stiffen the semiconductor structure 99, or can include multiple layers of different materials that can be selected and formed to control acoustic or mechanical vibrations.

Referring to FIGS. 2D and 2E, a handle substrate 50 is provided in step 125 and a conformable and curable bonding layer 40 is disposed on the optional capping layer 60 (as shown) or on the handle substrate 50 (not shown), in step 130. A conformable and curable bonding layer 40 can have a substantially planar side 42 opposite a non-planar side 44 closer to a completed semiconductor device 22. A handle substrate 50 can be substantially transparent, for example 50%, 70%, or 90% transparent to at least one of visible, UV, and IR electromagnetic radiation. A bonding layer 40 can be, for example, a curable resin, epoxy, SU-8, a metal layer, a metal alloy layer, a solder layer, or AuSn.

The handle substrate 50 is located in contact with the bonding layer 40 and bonded to the completed semiconductor devices 22 by, for example, curing the curable bonding layer 40 in step 135 (as shown in FIG. 2E), for example by providing time, heat, cooling, or electromagnetic radiation to the bonding layer 40, for example through the handle substrate 50. The material of the capping layer 60 provided in step 120 can be selected to prevent unwanted interactions between the release layer 30 etching chemistry and the bonding layer 40. For example, in some embodiments, an etchant that is suitable for etching the release layer 30 might also undesirably etch the bonding layer 40, resulting in compromise a micro-transfer printing process for the completed semiconductor device 22 if not for the presence of the optional capping layer 60.

Referring to FIG. 2F, the support substrate 10 is removed in step 140. In some embodiments, and as shown in FIG. 2F, a removal layer 26 is exposed to electromagnetic radiation 70 (for example from a laser) through a support substrate 10 (i.e., wherein the support substrate 10 is at least partially transparent to the electromagnetic radiation 70) to decompose at least a portion of the removal layer 26, as illustrated with shading in the removal layer 26 in FIG. 2F. In some embodiments, a removal layer 26, for example an ablation layer, absorbs is heated by the electromagnetic radiation 70 and evaporates or sublimates to a gas or plasma that forcefully dissociates a support substrate 10 from the removal layer 26. Ablation layers can be selected to complement the support substrate 10 or layer materials formed on or in the support substrate 10. An ablation layer can be the same material as is found in the semiconductor layers 20, for example GaN. Moreover, in some embodiments, GaN can serve as an ablation layer for sapphire or AlN support substrates 10. GaNAs or InGaNAsSb can be included in ablation layers or materials grown on GaAs substrates. InGaAs, InGaAsP, AlInGaAs, or AlInGaAsP can be included in ablation layers or materials grown on InP substrates. In some embodiments, black chromium can be an ablation layer. Ablation layers can include organic materials such as vaporizable polymer or materials that incorporate light-absorbing particles such as carbon black or oxidized chromium and that can absorb electromagnetic radiation, facilitate ablation layer heating, and ablate of the layer.

Typically, laser ablation transfers momentum to a surface and, in some embodiments of the present disclosure, can form a shock wave (an acoustic or mechanical pulse of high pressure) that passes into and through a completed semiconductor device 22 (or completed semiconductor devices 22, if multiple are present) and can damage the completed semiconductor device 22. A capping layer 60 (and, in some embodiments, to some extent, a bonding layer 40 and/or a release layer 30) can dissipate, disperse, deflect, reflect, or absorb the shock wave and prevent or mitigate damage to a completed semiconductor device 22. The layers, materials, and structure of a capping layer 60 can be specifically designed to prevent or mitigate damage to a completed semiconductor device 22. In some embodiments, a release layer 30 comprises germanium, which has a large acoustic impedance and can therefore effectively reflect or redirect at least a portion of a shock wave. In some embodiments of the present disclosure, laser ablation can be used to remove a support substrate 10 from a semiconductor structure 99 used in a flip-chip micro-transfer printing process, as shown in FIG. 2G.

In some methods and micro-transfer printable semiconductor structure 99 designs, removal of a support substrate 10 exposes the release layer 30 (e.g., as shown in FIG. 1F). However, in some embodiments, and as illustrated in FIG. 2G, a release layer 30 is not exposed in step 140. For example, a release layer can be covered by a dielectric layer 24. In some embodiments, a dielectric layer 24 is patterned to expose a portion of a release layer 30, as shown in FIG. 1F. However, in the illustrative embodiment shown in FIGS. 2F and 2G, the patterned dielectric layer 24 is not exposed when the support substrate 10 is removed. Thus, as illustrated in FIG. 2H, in step 145 an entry path 34 is formed to expose a portion of the patterned release layer 30. An entry path 34 can be formed, for example, by pattern-wise etching a dielectric layer 24 (or other layer disposed over a patterned release layer 30). In some embodiments, the step of forming an entry path 34 is the same step as removing a support substrate 10. That is, in some embodiments, removing a support substrate 10 forms an entry path 34 by exposing a portion of a release layer 30. As used herein, an "exposed" layer or element is one that is exposed to the local environment, can be exposed to a processing material such as a chemical etchant, can have materials deposited thereon, or any combination thereof. In some embodiments, a layer (e.g., a support substrate 10) is removed to expose an element (e.g., a completed semiconductor device 22) while one or more other layers (e.g., dielectric layers or a remaining portion of a removal layer 26) remain that need to be removed to provide an exposed element. For example, in some embodiments, a support substrate 10 is removed to expose a completed semiconductor device 22 and subsequently a sacrificial dielectric layer and/or remaining portion of a removal layer 26 disposed on the completed semiconductor device 22 is removed thereby providing an exposed completed semiconductor device 22.

Referring to FIG. 2I, the release layer 30 is removed in step 150, for example by etching as described above with respect to FIG. 1G. After etching, the release layer 30 forms a gap 32 or space between the completed semiconductor devices 22 and the capping layer 60. A release layer 30 and entry paths 34 are patterned so that one or more tethers 36 physically connect a completed semiconductor devices 22 to an anchor 38 disposed on the handle substrate 50 (e.g., wherein the anchor 38 is a portion of a dielectric layer 24, a capping layer 60, a handle substrate 50, or another layer disposed on the handle substrate 50) holds the completed semiconductor device 22 in place. Referring to FIG. 2I, the completed semiconductor devices 22 are physically connected to the anchors 38, where are portions of the dielectric layer 24. In some embodiments, a plurality of tethers 36 physically connect each completed semiconductor device 22 to one or more anchors 38 (e.g., a plurality of anchors 38). In some embodiments, a plurality of anchors 38 formed from portions of a bonding layer are physically connected to each completed semiconductor device 22. In the illustrative embodiment illustrated in FIG. 2I, each tether 36 is a portion of the dielectric layer 24. A tether 36 can be disposed in a common plane with an entry path 34 or an entry path 34 can extend through or around a tether 36. A tether 36 can be separated or broken (e.g., fractured) if pressure is applied to a completed semiconductor device 22. In some embodiments, a tether 36 is separated during transfer printing (e.g., by overcoming van der Waals forces that adhere a completed semiconductor device 22 to an anchor 38). In some embodiments, a tether 36 is fractured during transfer printing (e.g., wherein pressure fractures the dielectric material that the tether 36 is made from).

Figure 2J:
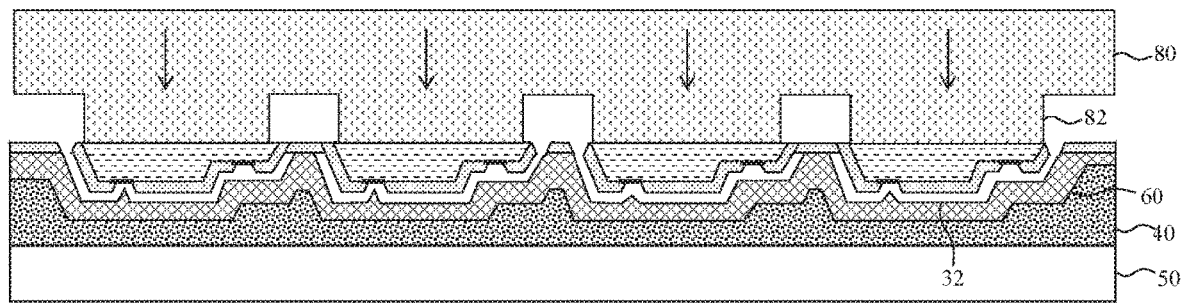
Figure 2K:
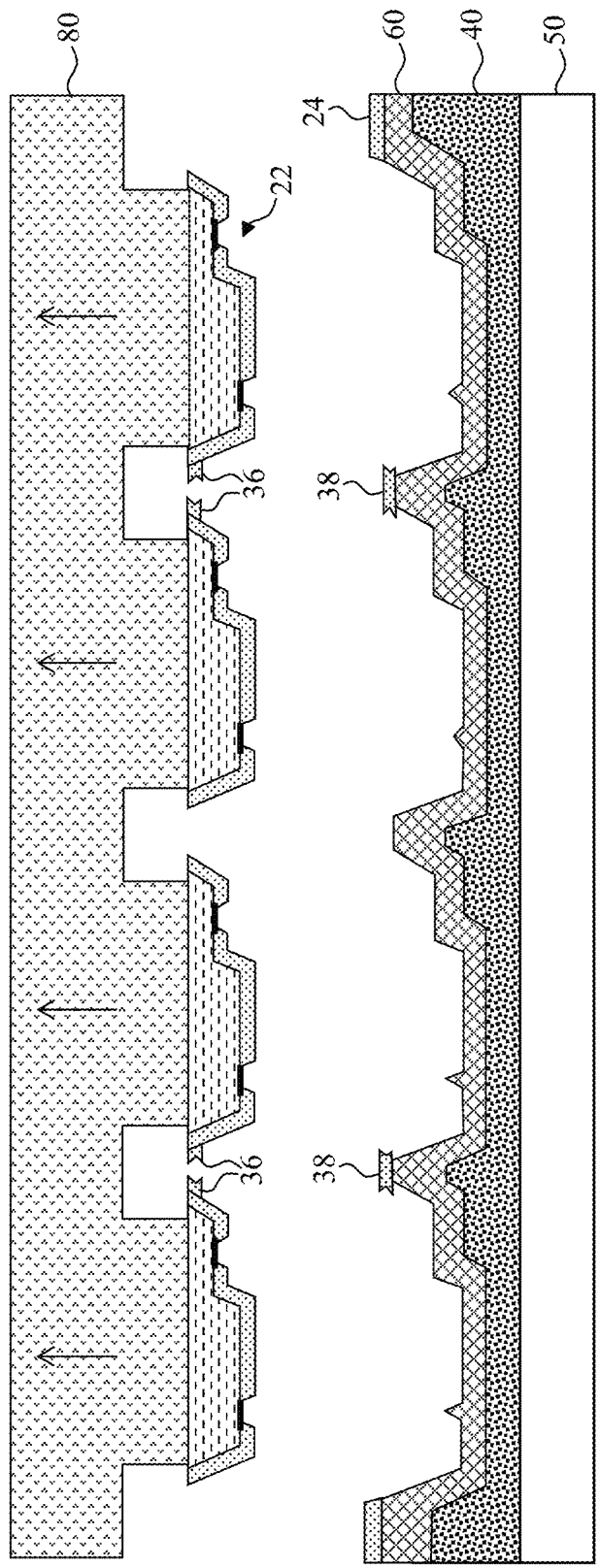

Once the release layer 30 is etched, the completed semiconductor devices 22 can be micro-transfer printed in step 160, as illustrated in FIG. 2J (shown with an inverted orientation from FIG. 2I), with a stamp 80 (e.g., an elastomeric stamp, for example comprising PDMS) comprising stamp pillars 82 that press against and adhere to the completed semiconductor devices 22 and is then separated from the handle substrate 50 (as shown in FIG. 2K). The completed semiconductor devices 22 are brought into aligned contact with a destination substrate 90 and micro-transfer printed to the destination substrate 90, as shown and described with respect to FIG. 1J.

Referring next to FIG. 3A, in some embodiments, semiconductor layer(s) 20 are formed in a support substrate 10, for example by doping (e.g., implanting) the support substrate 10 to form a layer on or at a surface (e.g., within the surface) of the support substrate 10 in step 105 that is the semiconductor layer(s) 20. The semiconductor layer(s) 20 can be processed in step 110 to form the completed semiconductor devices 22 (as shown in FIG. 3B). Thus, forming semiconductor layer(s) 20 in step 105 can include forming a layer on the support substrate 10 (as shown in FIGS. 1A, 2A) or forming a layer in the support substrate 10 (as shown in FIG. 3B).

Figure 4:
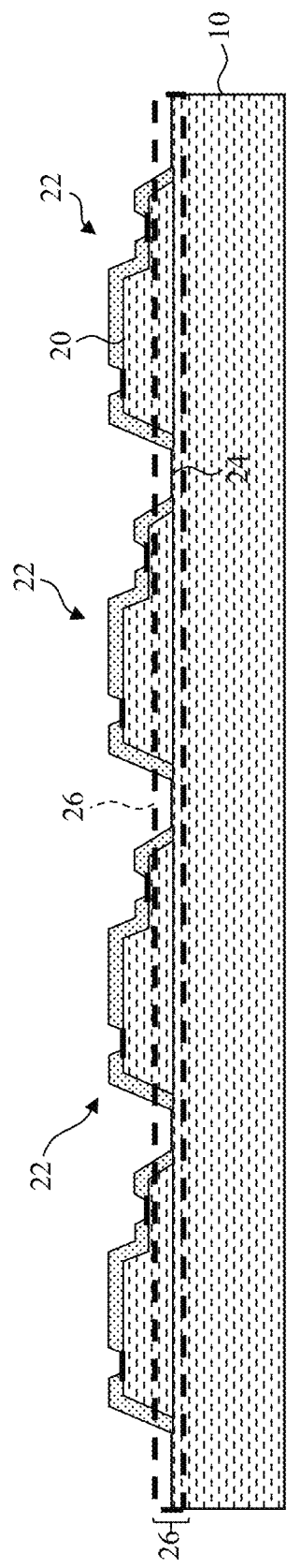
FIG. 4 is a cross section illustrating a semiconductor device with an ablation layer, according to illustrative embodiments of the present disclosure.

In some embodiments, and as shown in FIG. 4, a removal layer 26 is a portion of a completed semiconductor devices 22 and possibly other layers or a portion of a support substrate 10 (in which case the removal layer 26 includes a portion or layer of the support substrate 10). For example, in some embodiments, ablation can remove the portion of the structure indicated with the heavy dashed rectangle. Thus, in some embodiments, removing a support substrate 10 (e.g., as in step 140) comprises exposing semiconductor layer(s) 20 or completed semiconductor device 22 to electromagnetic radiation 70 through the support substrate 10 to decompose a portion of the semiconductor layer(s) 20 or the completed semiconductor device 22 and form a shock wave in a semiconductor structure 99. A capping layer 60, if present, can disperse, reflect, deflect, or absorb the shock wave.

Referring to FIG. 2K, each completed semiconductor device 22 has at least one individual broken (e.g., fractured) tether 36 as a consequence of micro-transfer printing. A broken tether 36 can be a fractured structure, as in FIG. 2K. A separated tether 36 can be an interface formed between two elements for which one element is removed, as in FIG. 1I. However, before tethers 36 are broken (as shown in FIG. 2J), two or more tethers 36 can be part of a common structure and be physically connected to a common anchor 38. Anchors 38 can be any portion of a semiconductor structure 99 that is not the completed semiconductor device 22, for example a bonding layer 40 (as shown in FIG. 1G), a dielectric layer 24 (as shown in FIG. 2I), or a capping layer 60.

Figure 5:
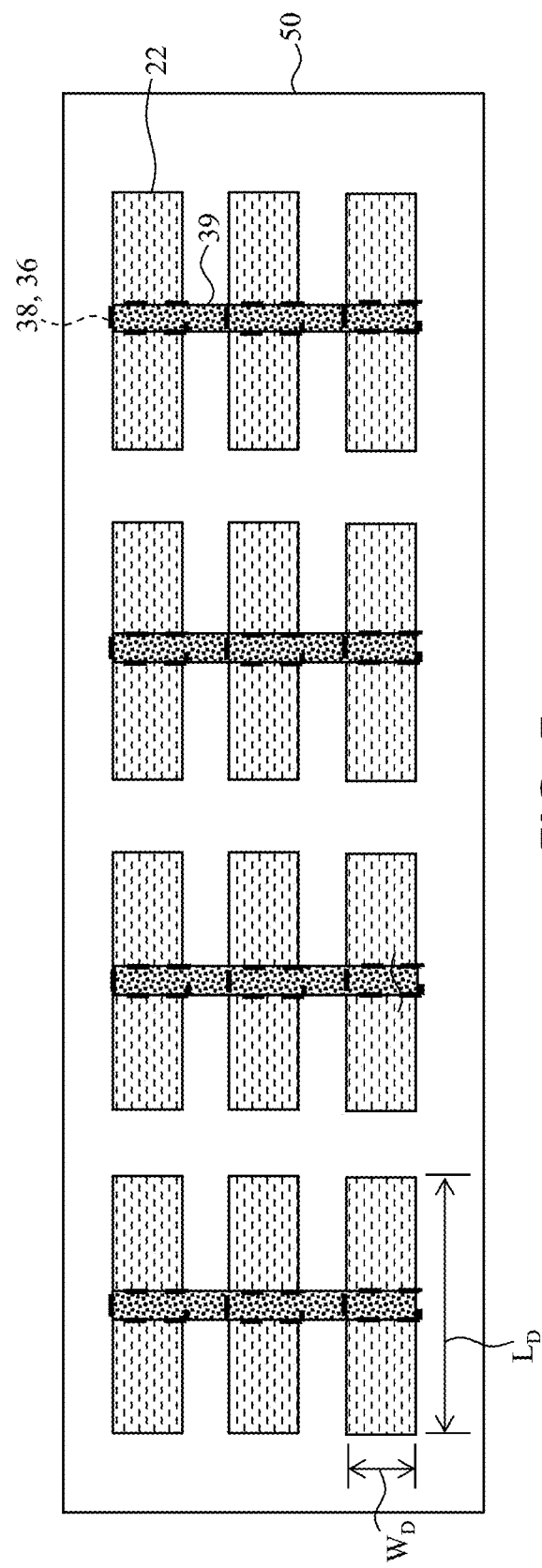
FIG. 5 is a plan view illustrating anchor, an anchor structure, and semiconductor devices on a source substrate, according to illustrative embodiments of the present disclosure.

Referring to the plan view of FIG. 5 and corresponding to the cross section of FIG. 1G viewed through the handle substrate 50 and excluding non-anchor portions of the bonding layer 40, in some embodiments, at least two of the plurality of completed semiconductor devices 22 are tethered to anchors 38 that are portions of an anchor structure 39 that is a ridge of material (e.g., that physically connects to each of two or more completed semiconductor devices 22 at an interface that is a tether 36). In the illustrative embodiment of FIG. 5, each anchor structure 39 comprises three anchors 38 physically connected to the tethers 36 of three corresponding completed semiconductor devices 22. In some embodiments, an anchor structure 39 comprises a plurality of anchors 38 (e.g., two or more or three or more anchors).

In some embodiments of the present disclosure (not shown), a completed semiconductor device 22 has a semiconductor structure with a planar surface adjacent to a patterned release layer 30 opposite a support substrate 10 so that electrical contacts 25 of the completed semiconductor device are in a common plane. This arrangement facilitates electrical connection between the electrical contacts 25 and contact pads 92 on a destination substrate 90. In some embodiments, contact pads 92 are likewise in a common plane on a surface of a destination substrate 90, so that electrical contacts 25 in a common plane can both contact each contact pad 92 at the same time. However, in some embodiments and as illustrated in FIGS. 1B-C and 2C, a completed semiconductor device 22 has a semiconductor structure with a non-planar surface adjacent to a patterned release layer 30 and opposite a support substrate 10 so that electrical contacts 25 are not in a common plane. Thus, it can be necessary to adjust the structure or arrangement of the completed semiconductor device 22 or destination substrate 90 in order to form an electrical connection between the completed semiconductor device 22 and contact pads 92 on the destination substrate 90 when the completed semiconductor device 22 is transfer printed (e.g., micro-transfer printed) to the destination substrate 90.

In some embodiments, and as shown in FIG. 1J, a destination substrate 90 has a non-planar surface with a topography that corresponds to a non-planar completed semiconductor device 22 surface. Accordingly, contact pads 92 (which provide at least a portion of the surface topography of a destination substrate 90) can have different heights that correspond to different locations of a non-planar completed semiconductor device 22 surface, in particular the different heights of the electrical contacts 25 of the completed semiconductor structures 22 over the destination substrate 90, so that the contact pads 92 can readily make electrical connections with the electrical contacts 25.

Figure 6A:
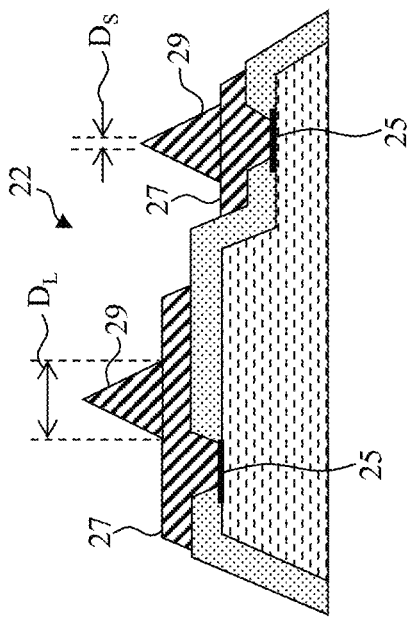

In some embodiments, and referring to FIGS. 6A-6E, the structure of the completed semiconductor devices 22 is adapted with electrodes 27 and/or connection posts 29. Referring to FIG. 6A, the completed semiconductor device 22 includes a non-semiconductor structure (electrodes 27) electrically connected to the electrical contacts 25 on a side of the completed semiconductor device 22 opposite a support substrate 10 (not shown). Exposed portions of the electrodes 27 together form at least a portion of a common planar surface for the completed semiconductor device 22 and provide a surface for forming electrical connections. The electrodes 27 are electrically connected to the electrical contacts 25. When flipped and micro-transfer printed onto a destination substrate 90 (e.g., in accordance with FIG. 1J), the exposed portions of the electrodes 27 can be in contact with and can readily electrically connect to planar contact pads 92 on the destination substrate 90. Since the electrical contacts 25 are not in a common plane, each of the electrodes 27 have a different thickness, $D_L$, $D_S$, as shown, to provide a surface that is in a common plane. Electrodes 27 can be electrically conductive and made of metal or a conductive metal oxide and can be formed using conventional photolithographic methods, for example deposition [e.g., by chemical evaporation or physical vapor deposition (e.g., sputtering)] and patterning (e.g., by pattern-wise etching). Different thicknesses $D_L$, $D_S$ can be achieved by multiple deposition and patterning steps.

In some embodiments, each electrical contact 25 includes a connection post 29. In some embodiments, referring to FIG. 6B, each electrical contact 25 is electrically connected to an electrode 27 and a connection post 29 is electrically connected to each electrode 27. In some embodiments, an electrode 27 includes or forms a connection post 29. Connection posts 29 can be electrically conductive and, for example, can be made of metal or a conductive metal oxide, as can the electrodes 27 and made using photolithographic methods and materials. Connection posts 29 can be made of the same material(s) as electrodes 27 and can be made in common steps or processes. A connection post 29 and corresponding electrode 27 can be a common structure so that it can be considered that the connection post 29 includes the electrode 27 or the electrode 27 includes the connection post 29. In some embodiments, a connection post 29 extends (e.g., protrudes) from a surface of a completed semiconductor device 22 and, when micro-transfer printed to a destination substrate 90, can electrically connect to contact pads 92 on the destination substrate 90.

Figure 6B:
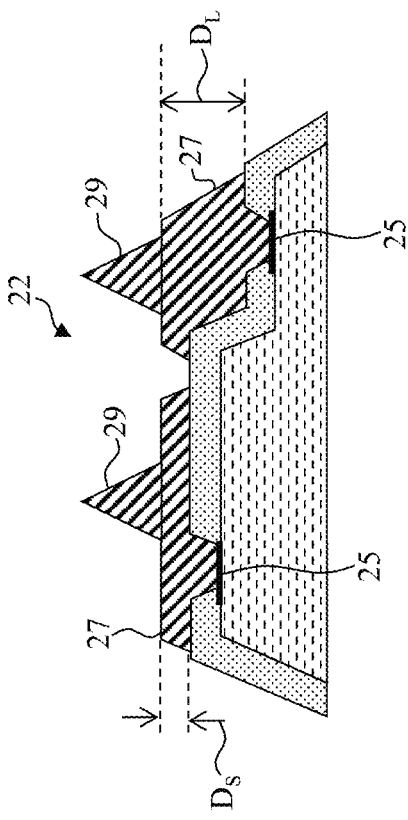

In some embodiments, referring to the connection posts in FIG. 6B, to facilitate electrically connecting connection posts 29 to contact pads 92, each connection post 29 has a first surface adjacent to a surface of a completed semiconductor device 22 and a second opposing surface, wherein the second opposing surface has a smaller area or dimension $D_S$ than an area or dimension $D_L$ of the first surface. Therefore, for example, a connection post 29 can have a relatively sharp point and can form a spike, as shown in FIG. 6B. In some embodiments, a connection post 29 is cylindrical or has a constant rectangular cross section parallel to a surface of a completed semiconductor device 22. Furthermore, in some embodiments, a connection post 29 can have a height that is greater than a dimension of a cross section perpendicular to the height (e.g., a dimension of a first surface or a dimension of the second opposing surface as described in reference to FIG. 6B). Thus, in some embodiments, a connection post 29 has an elongated aspect ratio (e.g., a height to width aspect ratio greater than 1:1), a height that is greater than a width, and, optionally, a sharp point.

Figure 6C:
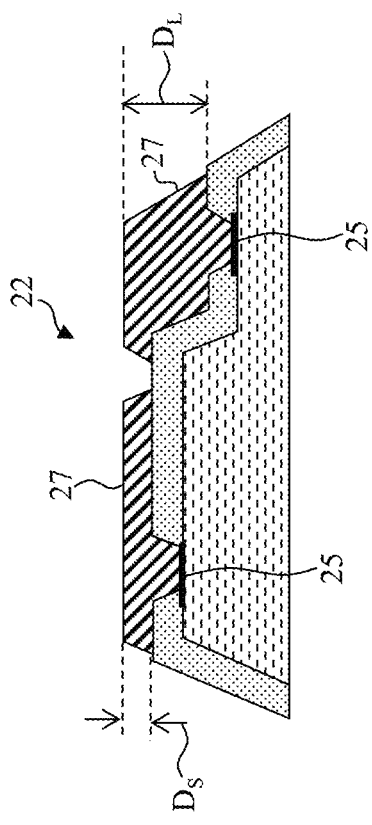
Figure 6D:
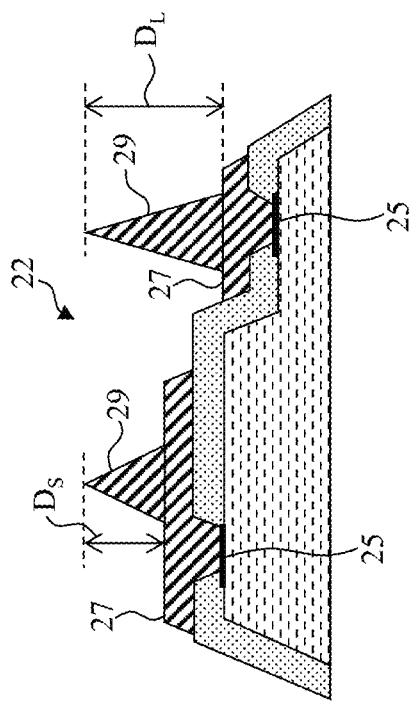

Referring to FIG. 6C, the connection posts 29 have different heights or dimensions $D_S$, $D_L$ so the different connection posts 29 have a common projection distance from the completed semiconductor device 22. In some embodiments, a plurality of connection posts 29 connected to a completed semiconductor device 22 terminate in a common plane. Referring to FIG. 6D, the structures of FIGS. 6A and 6B are combined to provide connection posts 29 that have a common projection distance from the completed semiconductor device 22 using different electrode 27 thicknesses $D_S$, $D_L$ and common connection post 29 sizes. Referring to FIG. 6E, surfaces at opposing edges of the completed semiconductor device 22 are in a common plane.

A first one of the electrical contacts 25 is located at the bottom of a well, pit, or depression in the completed semiconductor device 22 and is electrically connected to a first electrode 27A. A second electrode 27B is in electrical contact with a second electrical contact 25 electrically separate from the first electrical contact 25. The first electrode 27A has a greater height $D_L$ than the height $D_S$ of the second electrode 27B so that exposed portions of the first and second electrodes 27A, 27B together are in a common plane. The electrodes 27 are in contact with and electrically connected to the electrical contacts 25. Exposed portions of the first and second electrodes 27A, 27B are used to make electrical contact to external electrical conductors, such as contact pads 92 on a destination substrate 90.

Referring to FIG. 6F, surfaces at opposing edges of the completed semiconductor device 22 are not necessarily in a common plane. A first one of the electrical contacts 25 is located at a lower location at the bottom of a well, pit, or depression in the completed semiconductor device 22 and is electrically connected to a first electrode 27A. A second electrode 27B is in electrical contact with a second electrical contact 25 electrically separate from the first electrical contact 25 at a higher location relative to the first one of the electrical contacts 25. However, the first electrode 27A extends from the lower location to the upper location over a surface of the completed semiconductor device. Thus, the first electrode 27A has a greater height $D_L$ than the height $D_S$ of the second electrode 27B so that exposed portions of the first and second electrodes 27A, 27B together are in a common plane in the upper location and exposed portions of the first and second electrodes 27A, 27B are in different planes in the upper and lower locations, respectively. Exposed portions of the first and second electrodes 27A, 27B are used to make electrical contact to external electrical conductors, such as contact pads 92 on a destination substrate 90.

Connection posts 29 can be formed by repeated masking and deposition processes that build up three-dimensional structures. In certain embodiments, for example those in which electrodes 27 have an exposed portion in a common plane such as in FIGS. 6A and 6D-6F, connection posts 29 can be formed by coating the electrodes 27 with a first polymer layer, for example a lift-off resist layer, coating the first polymer layer with a second polymer layer, for example a photoresist layer having different etching characteristics than the first polymer layer, patterning the second polymer layer to form vias in the second polymer layer, and etching the first polymer layer through the vias to form a deeper via having an undercut in the first polymer layer with respect to the second polymer layer via. A conductive metal, such as gold, can be evaporated over the second polymer layer to form an evaporated metal structure within the deeper via. Because the via is undercut in the first polymer layer, the base of the evaporated metal structure in the first polymer layer is wider than the top in the second polymer layer, for example forming a sharp point. The first and second polymer layers are then removed, for example using a lift-off technique, leaving a sharp-pointed connection post 29 formed on each of the first and second electrical contacts 25. The connection post 29 can be, for example gold (Au) with a width of 1.8 microns and a height of 4 microns. In some embodiments, a polymer structure with a width smaller than a width of the first and second electrical contacts 25 is formed on each of the first and second electrical contacts 25, for example by patterning a photoresist layer. A metal layer is then evaporated over the polymer structures to form an electrically conductive connection post 29 that is electrically connected to the electrical contacts 25. The remaining metal in the layer is then pattern-wise removed, for example by coating and patterning a photoresist layer, removing the exposed photoresist, etching the exposed metal layer, and then removing the remaining photoresist to expose the connection posts 29.

In some embodiments, connection posts comprise multiple layers [e.g., made of different materials (e.g., wherein each layer is made of a material that has a different elastic modulus)]. In some embodiments, connection posts 29 are made of one or more high elastic modulus metals, such as tungsten. As used herein, a high elastic modulus is an elastic modulus sufficient for a connection post 29 made of the material to maintain its function and structure when pressed into a contact pad 92 disposed on a destination substrate 90 (e.g., electrical conductivity does not degrade due to deformation). Connection posts 29 can be made by etching one or more layers of electrically conductive metal or metal oxide evaporated or sputtered on a side of semiconductor layers 20 opposite a support substrate 10. Connection posts 29 can have a variety of aspect ratios and typically have a peak area smaller than a base area. Connection posts 29 can have a sharp point for embedding in or piercing contact pads 92 of a destination substrate 90. Connection posts 29 that extend (e.g., protrude) from semiconductor devices generally are discussed in U.S. Pat. No. 8,889,485, the disclosure of which is incorporated by reference herein in its entirety.

Figure 7:
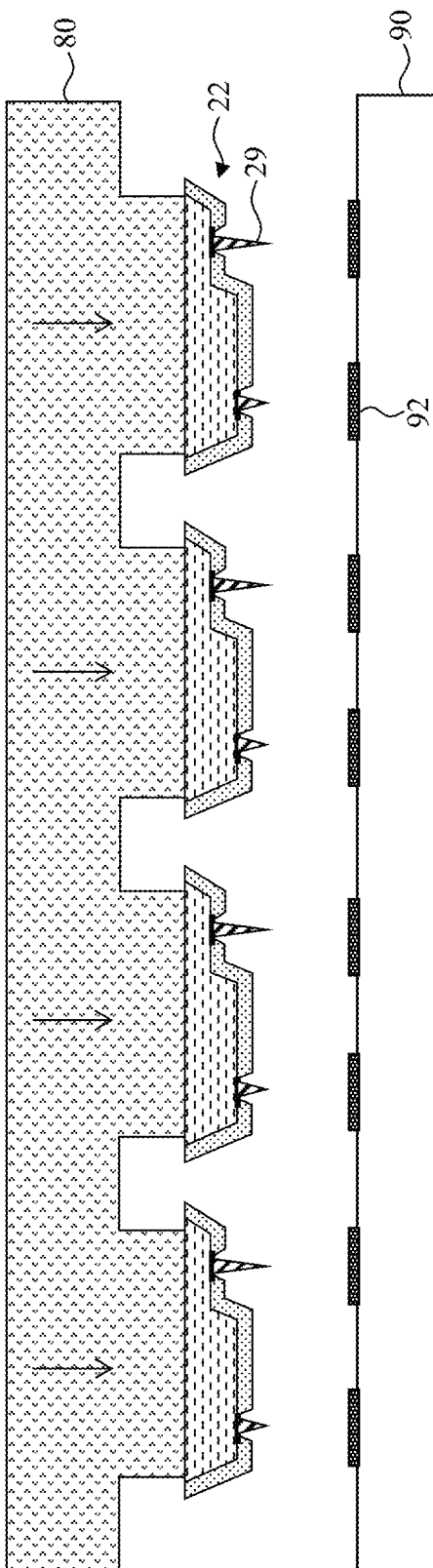
FIG. 7 is a cross section illustrating micro-transfer-printed completed semiconductor devices with a connection post structure and a destination substrate in accordance with an embodiment of the present disclosure.
Figure 8:
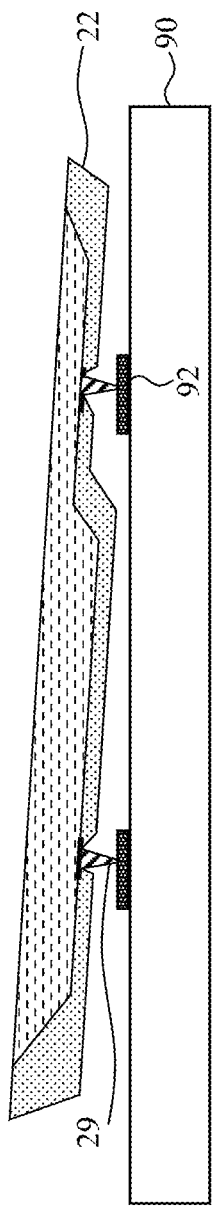
FIG. 8 is a cross section illustrating a completed semiconductor device with a connection post structure and a destination substrate, according to illustrative embodiments of the present disclosure.
Figure 9:
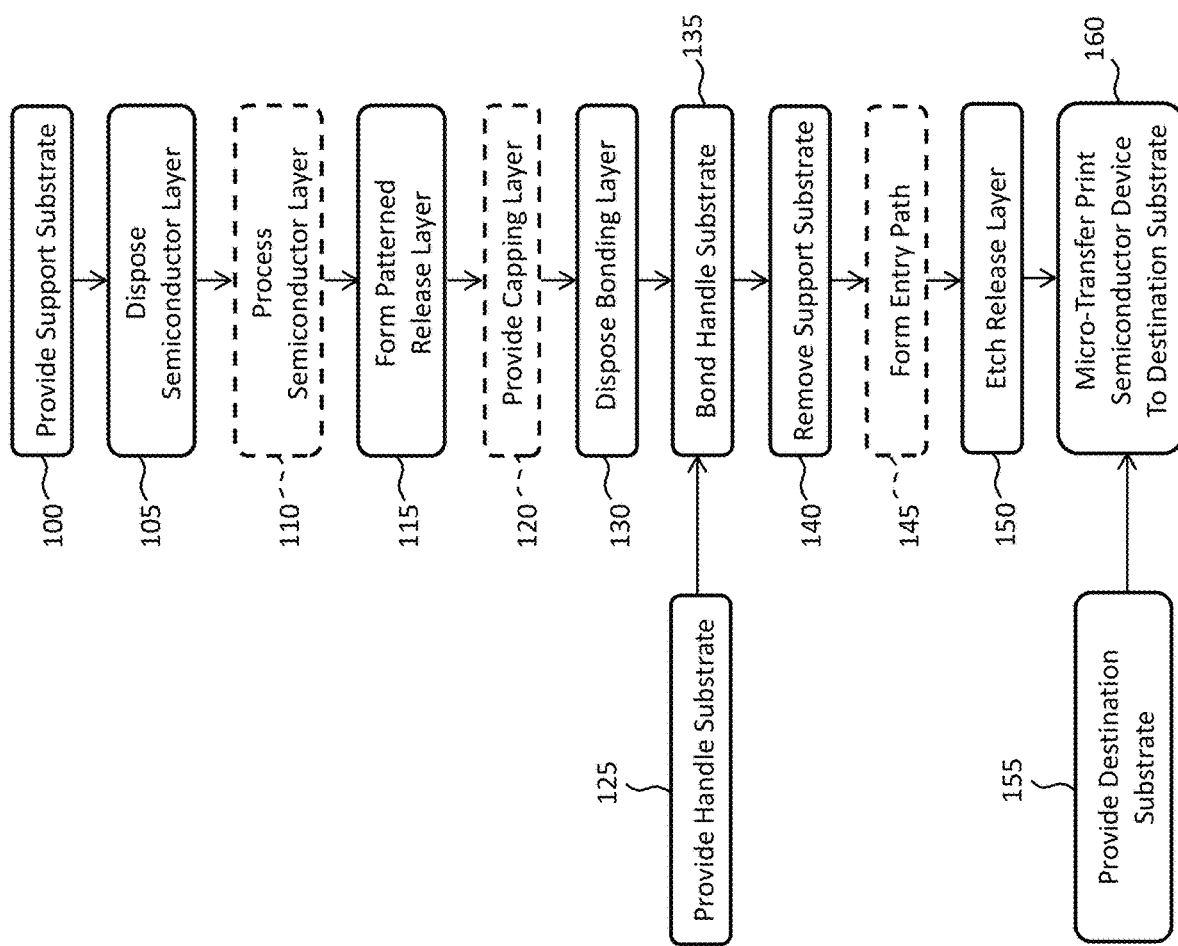
FIG. 9 is a flow chart illustrating exemplary methods, according to illustrative embodiments of the present disclosure.

Referring to FIGS. 7 and 8, in some embodiments of the present disclosure, completed semiconductor devices 22 in accordance with at least one of FIGS. 6B-6D are illustrated with a destination substrate 90 onto which the completed semiconductor devices 22 are micro-transfer printed. As shown in FIG. 7, the completed semiconductor devices 22 with connection posts 29 disposed thereon (e.g., in accordance with FIG. 6C or FIG. 6D) are micro-transfer printed onto the destination substrate 90 so that the connection posts 29 are aligned with and will pierce or otherwise electrically connect (e.g., by contacting) with the contact pads 92 of the destination substrate 90. Because the connection posts 29 extend a common projection distance from the completed semiconductor device 22, the top or bottom surfaces of the completed semiconductor devices 22 are substantially parallel to the destination substrate 90. In contrast, referring to FIG. 8, the completed semiconductor devices 22 (in accordance with FIG. 6B) have top or bottom surfaces of the completed semiconductor devices 22 that are not substantially parallel to the destination substrate 90 because the connection posts 29 do not project a common distance from the completed semiconductor device 22. However, because the size of the completed semiconductor devices 22 over the destination substrate 90 is relatively large compared to the difference in protrusion distance of the connection posts 29, the completed semiconductor devices 22 can be successfully printed onto the destination substrate 90 and successfully make an electrical connection to the contact pads 92. As shown in FIG. 8, the completed semiconductor device 22 is only slightly tilted (e.g., angled) with respect to a surface 91 of the destination substrate 90 after transfer printing. By angled or tilted is meant that the surfaces or structures are not parallel.

According to some embodiments of the present disclosure, and as illustrated in FIGS. 1F-1G and 2G-2I, an exemplary semiconductor structure 99 suitable for micro-transfer printing made by a method disclosed herein includes a handle substrate 50, a cured bonding layer 40 disposed in contact with the handle substrate 50, an optional capping layer 60 disposed in contact with the bonding layer 40, a patterned release layer 30 disposed in contact with the cured bonding layer 40 or the capping layer 60 (if present), an entry path 34 existing between the patterned release layer 30 and the local environment, and one or more completed semiconductor devices 22 disposed on or over the patterned release layer 30 and attached to an anchor 38 disposed on the handle substrate 50 with at least one tether 36. A tether 36 can be disposed between a completed semiconductor device 22 and a handle substrate 50, for example, connecting the completed semiconductor device 22 to an anchor 38 post (e.g., wherein the tether 36 is a connection interface). In some embodiments, a tether 36 is disposed in a common plane with an entry path 34.

A completed semiconductor device 22 can include one or more of a semiconductor material, a compound semiconductor material, GaN, Si, InP, SiGe, and GaAs. A patterned release layer 30 can include one or more of germanium, Si, TiW, Al, Ti, a lift-off resist, and other polymers and, when etched or otherwise removed, forms a gap 32 or space (e.g., between a bonding layer 40 or a capping layer 60 and a completed semiconductor device 22). A curable bonding layer 40 can comprise or consist essentially of a curable resin, a curable epoxy, a metal layer, a metal alloy layer, a solder layer, or a layer of AuSn, for example. A cured bonding layer 40 can comprise or consist essentially of a cured resin, epoxy, a metal layer, a metal alloy layer, a solder layer, or a layer of AuSn, for example.

In some embodiments, a completed semiconductor device 22 can be exposed or the entry path 34 can be exposed. In some embodiments, a removal layer 26 (e.g., an ablation or etch-stop layer) is a portion, but only a portion, of a completed semiconductor device 22. In some embodiments, a semiconductor structure 99 includes a removal layer 26 in contact with a completed semiconductor device 22 and is disposed on or over, or is a part of, a support substrate 10 (e.g., can be patterned). In some embodiments, a support substrate 10 is in contact with a completed semiconductor device 22 or a removal layer 26 (and the removal layer 26 is in contact with the completed semiconductor device 22). A support substrate 10 can be one or more of sapphire, quartz, silicon, GaAs, GaN, InP, SiC, GaP, GaSb, AlN, and MgO. A support substrate 10 can be a growth substrate, can have a semiconductor seed layer, or can be a semiconductor layer 20.

A support substrate 10 can be removed by laser ablating a removal layer 26 disposed thereon or a portion of a completed semiconductor device 22, causing a mechanical or acoustic shock wave to propagate through the completed semiconductor device 22. To reduce or avoid damage from the shock wave, in some embodiments, a capping layer 60 has a thickness and layer material shape or structure to disperse, deflect, reflect, or absorb the shock wave. A capping layer 60 can have a plurality of layers and different materials.

In some embodiments, a completed semiconductor device 22 includes a semiconductor structure with a non-planar surface adjacent to a patterned release layer 30. A completed semiconductor device 22 can include a non-semiconductor structure in contact with the non-planar semiconductor structure surface adjacent to a patterned release layer 30 so that the non-semiconductor structure forms at least a portion of a planar surface for the completed semiconductor device 22.

In some embodiments, completed semiconductor devices 22 can be micro-transfer printed from a handle substrate 50 to a destination substrate 90. A destination substrate 90 can have a non-planar surface with a topography that corresponds to a non-planar semiconductor structure surface of the completed semiconductor device 22.

In some embodiments, a completed semiconductor device 22 includes an electrical contact 25 on the side of the completed semiconductor device 22 adjacent to a support substrate 10 or an electrical contact 25 on the side of the completed semiconductor device 22 adjacent to a patterned release layer 30 (as shown, for example, in FIG. 1B). In some embodiments, each electrical contact 25 includes an electrically conductive connection post 29. In some embodiments, an electrode is disposed on and electrically connected to each electrical contact 25 in a completed semiconductor device 22 and a connection post 29 is electrically connected to each electrode 27. In some embodiments, an electrode 27 includes or forms a connection post 29 or the connection post 29 includes or forms an electrode 27.

Connection posts 29 can have a first surface adjacent to a surface of the completed semiconductor device 22 and a second opposing surface with a smaller area than the first surface such that the connection posts are tapered. In some embodiments, a tapered connection post 29 has a height to width aspect ratio greater than 1:1, wherein the width of a connection post 29 is taken from a cross section of the connection post 29 perpendicular to the height dimension [e.g., taken as a maximal width of the connection post 29 (e.g., the width of a base of a connection post 29)]. A connection post 29 can have a height that is greater than a dimension of the first surface or a height that is greater than a dimension of the second opposing surface. A connection post 29 can have a sharp point.

In some embodiments, a semiconductor structure 99 includes a plurality of completed semiconductor devices 22 each of which has at least one individual tether 36 physically connected to at least one individual anchor 38. In some embodiments, at least two of the plurality of completed semiconductor devices 22 are physically connected to a common structure comprising at least one tether 36 for each completed semiconductor device 22. In some embodiments, a semiconductor structure 99 comprises at least one common anchor structure 39 to which a plurality of completed semiconductor structures 22 are physically connected, each by at least one tether 36. In some embodiments, at least two of a plurality of completed semiconductor devices 22 are physically connected to a common anchor structure 39 that is a ridge of material (e.g., that physically connects to each of two or more completed semiconductor devices 22 at an interface that is a tether 36).

Figure 10A:
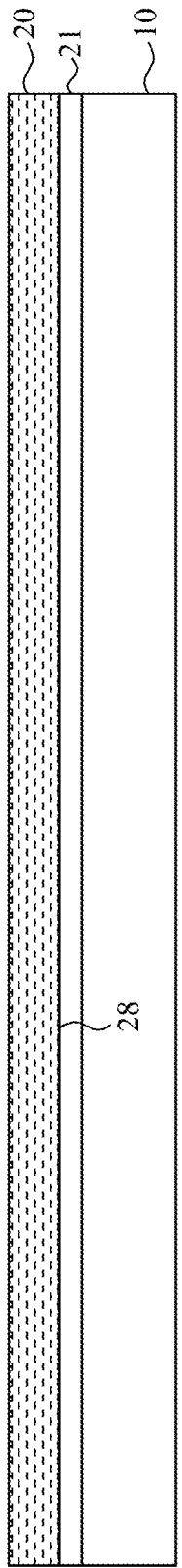
FIGS. 10A-10O are successive cross sections illustrating sequential steps in an exemplary method according to illustrative embodiments of the present disclosure.
Figure 10B:
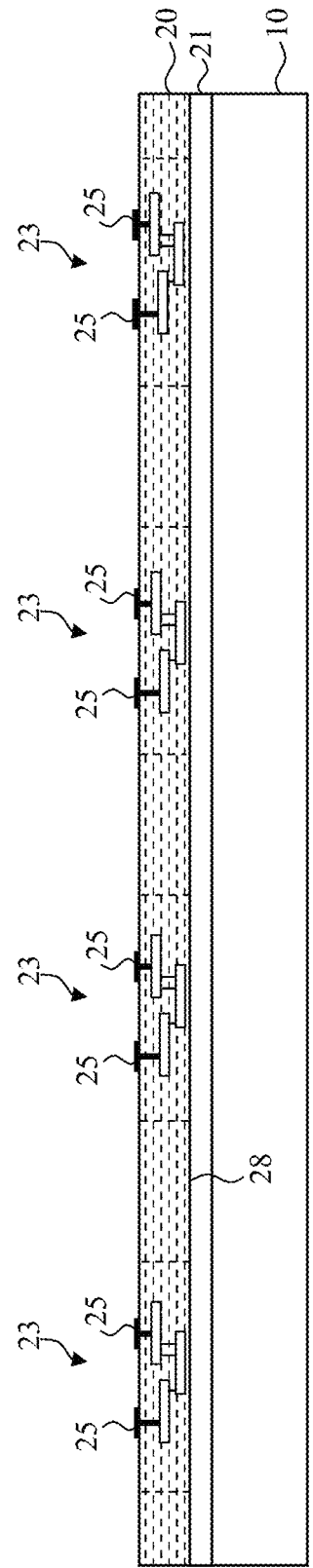
Figure 10C:
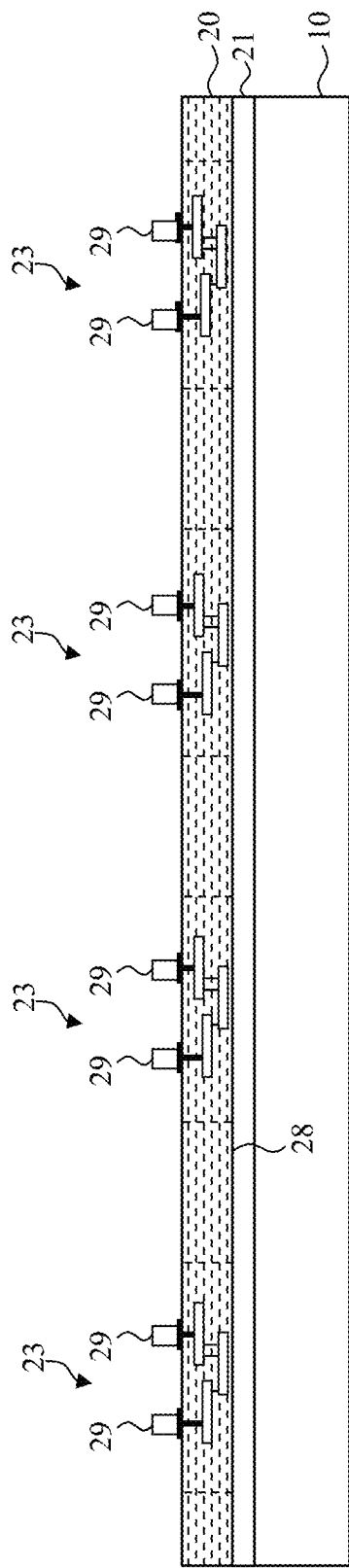
Figure 10D:
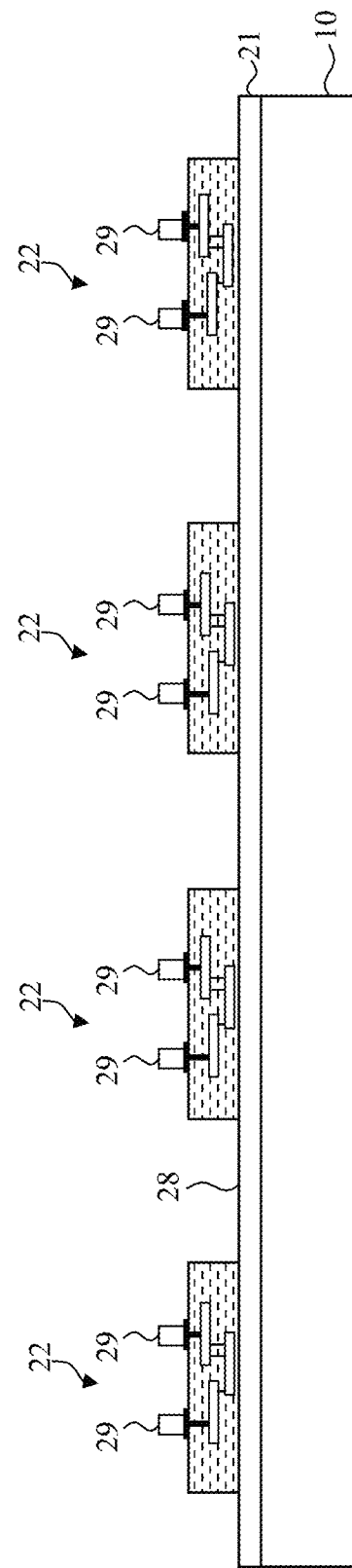
Figure 10E:
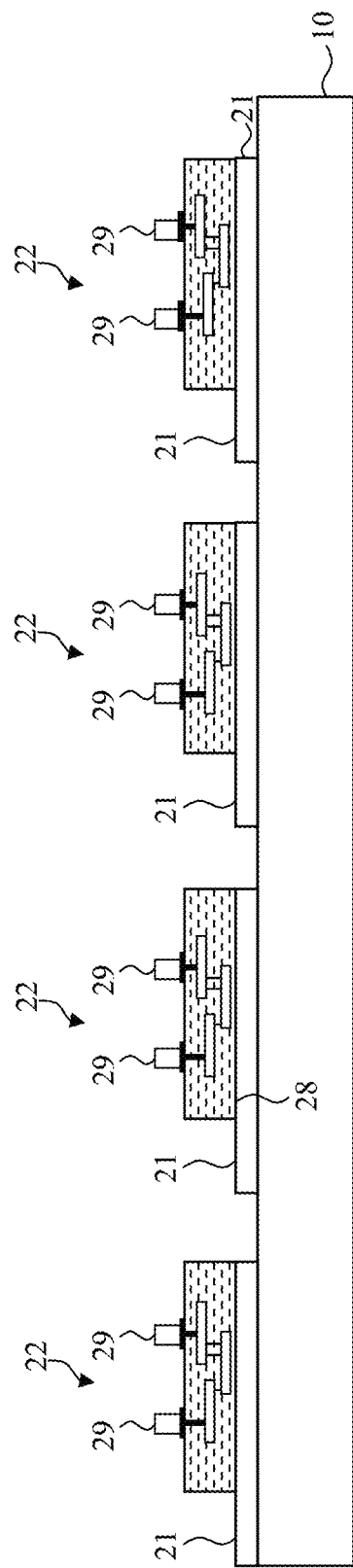
Figure 10F:
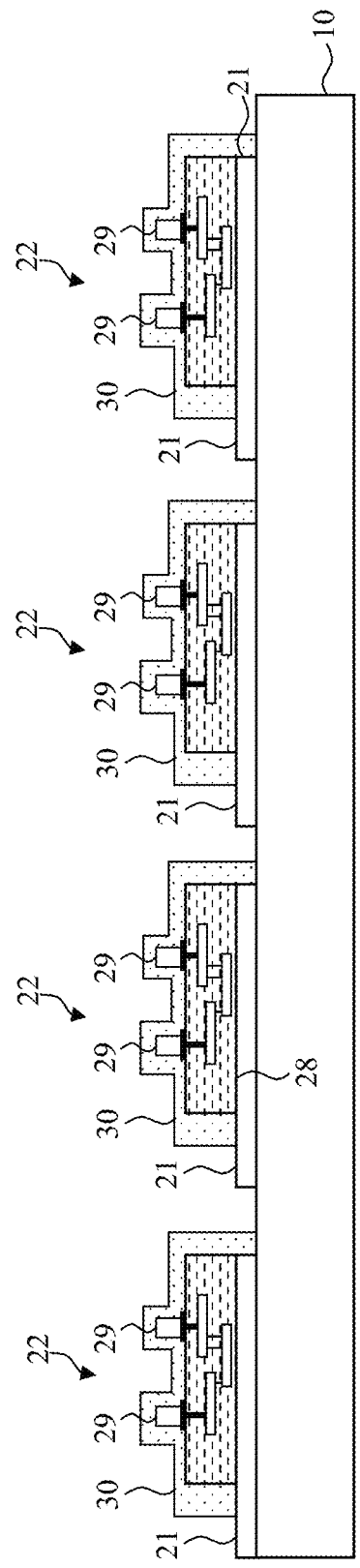
Figure 10G:
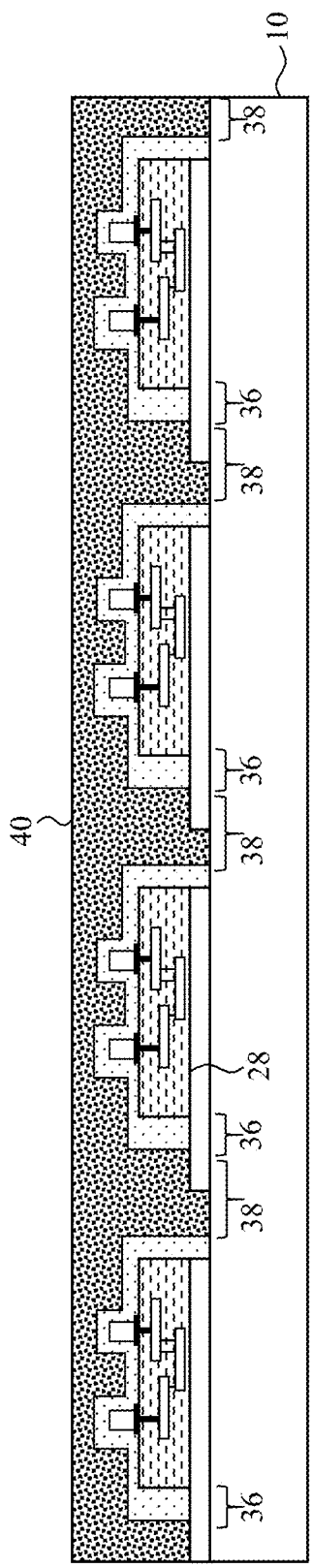
Figure 10H:
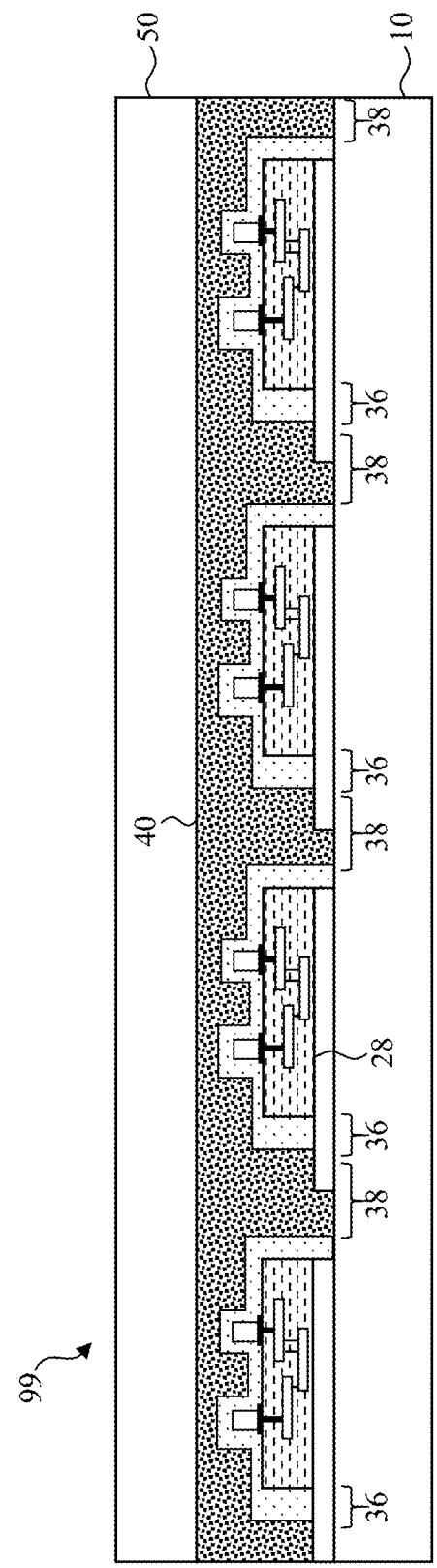
Figure 10I:
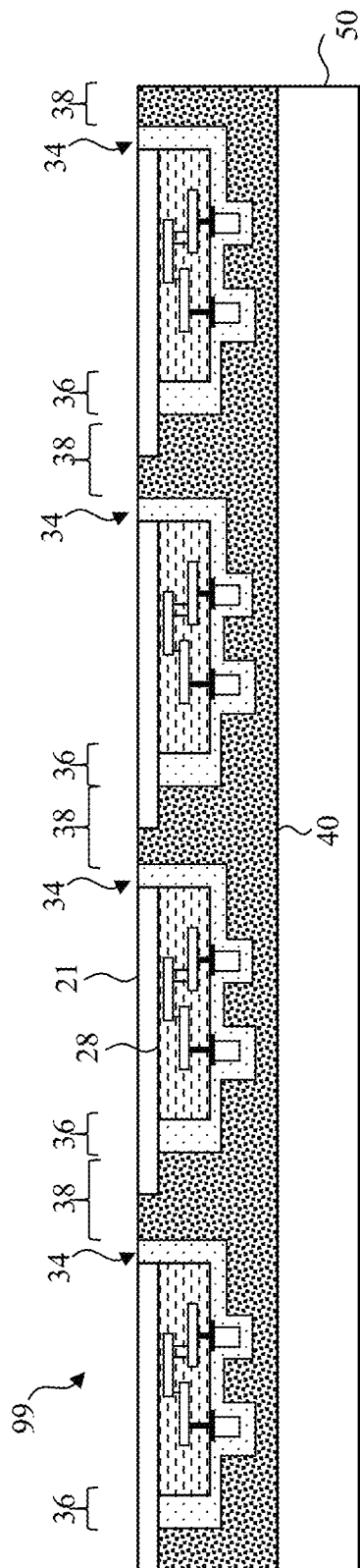
Figure 10J:
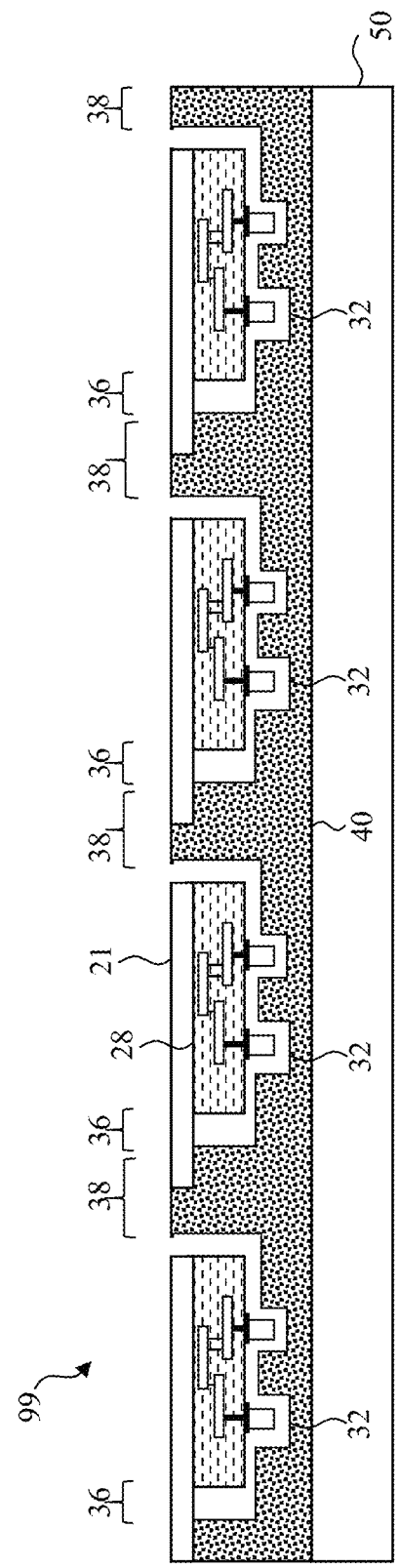
Figure 10M:
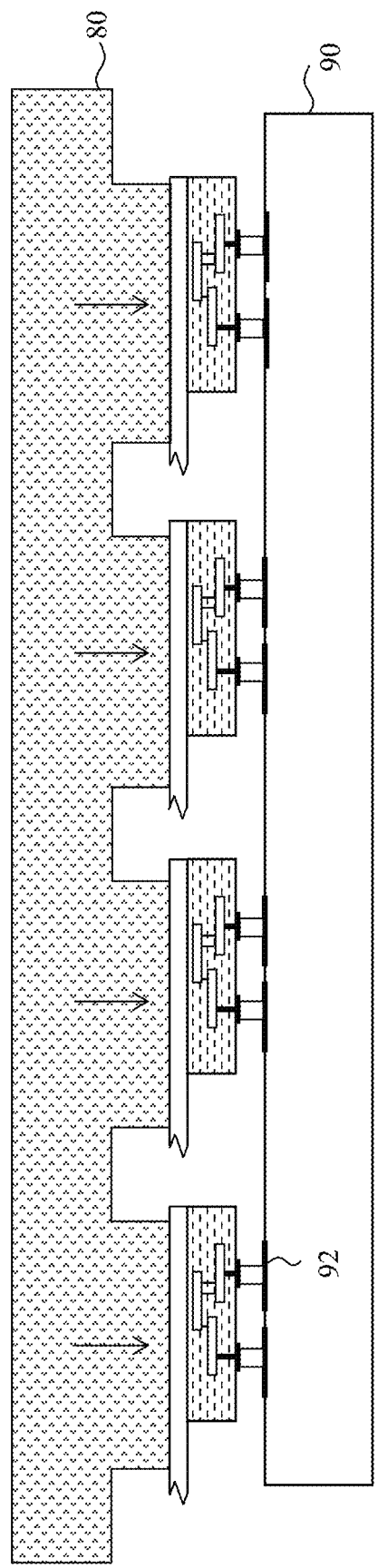
Figure 10N:
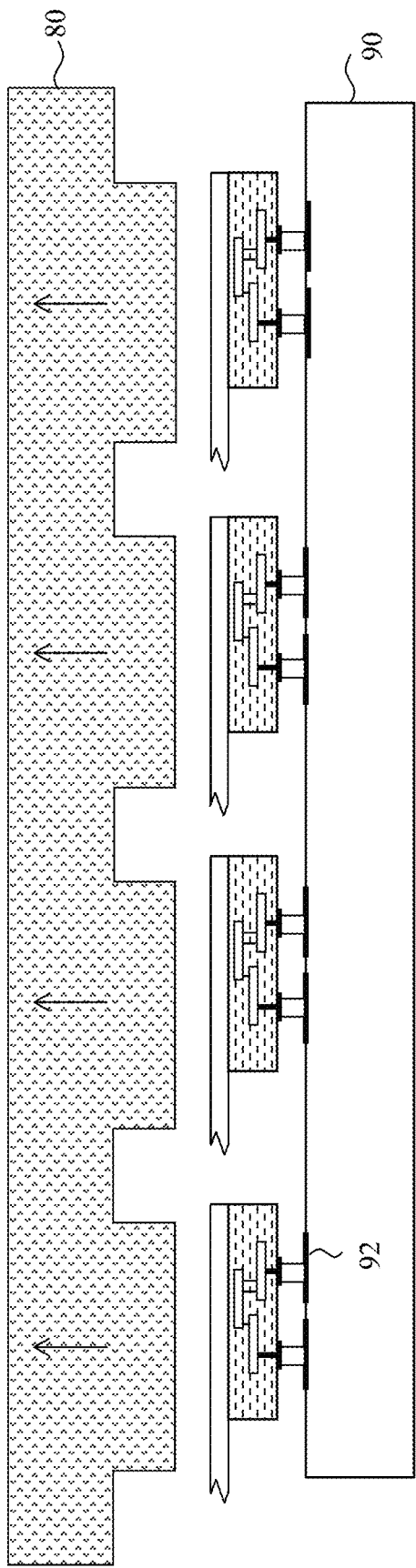
Figure 10O:
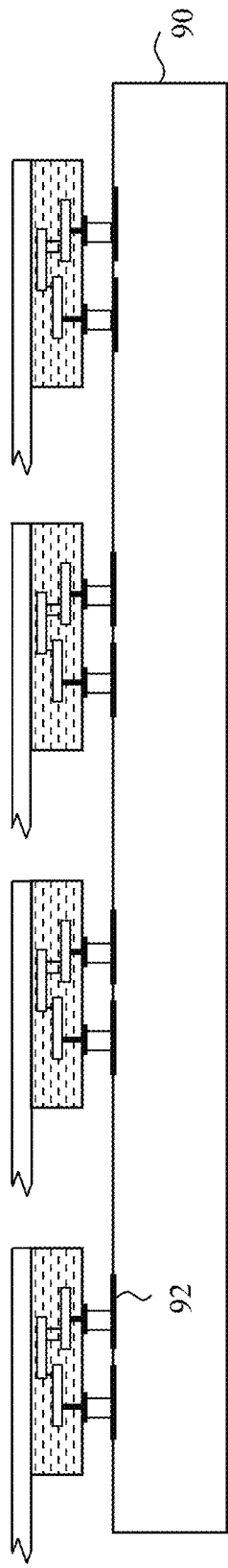

In some embodiments of the present disclosure, and referring to FIGS. 10A-10O and also described above, a semiconductor structure 99 suitable for transfer printing (e.g., micro-transfer printing) comprises a handle substrate 50, a bonding layer 40 disposed in contact with the handle substrate 50, and a patterned release layer 30 disposed in contact with the bonding layer 40, wherein a portion of the patterned release layer 30 is exposed, for example exposed to the atmosphere or processing chemicals, reagents, plasmas, gases, or etchants, for example as shown in FIG. 10I. The exposed portion of a patterned release layer 30 can form an entry path 34 (as shown in FIGS. 10I, 2H, described further below). A plurality of completed semiconductor devices 22 are disposed on or over the patterned release layer 30 and are each attached to an anchor 38 disposed on a handle substrate 50, e.g. a portion of a bonding layer 40, with at least one tether 36. Each completed semiconductor device 22 comprises at least one electrical contact 25 on a side of the completed semiconductor device 22 between the completed semiconductor device 22 and the handle substrate 50 (e.g., as shown in FIG. 10D). A connection post 29 is disposed on each electrical contact 25 and extends from the electrical contact 25 toward a handle substrate 50 (e.g., as shown in FIG. 10E). A patterned semiconductor support layer 21 comprises a surface (e.g., a substantially planar surface 28) on which is disposed a completed semiconductor device 22. The surface 28 is also in contact with a portion of a patterned release layer 30.

In some embodiments of the present disclosure, a semiconductor structure 99 comprises a support substrate 10 in contact with a semiconductor support layer 21, for example as shown in FIGS. 10G and 10H. In some embodiments, a support substrate 10 comprises a removal layer 26, for example as shown in FIG. 2A. In some such embodiments, a portion of a patterned release layer 30 is in contact with a support substrate 10, a layer on a support substrate 10, or a removal layer 26.

In some embodiments of the present disclosure and also as described above, a portion of a completed semiconductor device 22 or a semiconductor support layer 21 is a removal layer, or a semiconductor structure comprises a removal layer (e.g., removal layer 26) in contact with a completed semiconductor device 22.

In some embodiments of the present disclosure, as shown in FIG. 10I and as discussed above (for example with respect to FIG. 1G), a patterned release layer 30 defines a gap 32 between a completed semiconductor device 22 and a bonding layer 40. In some embodiments, and as illustrated in FIGS. 6B-6D, each connection post 29 is tapered or a connection post 29 has a height to width aspect ratio of greater than 1:1, or both.

Figure 11:
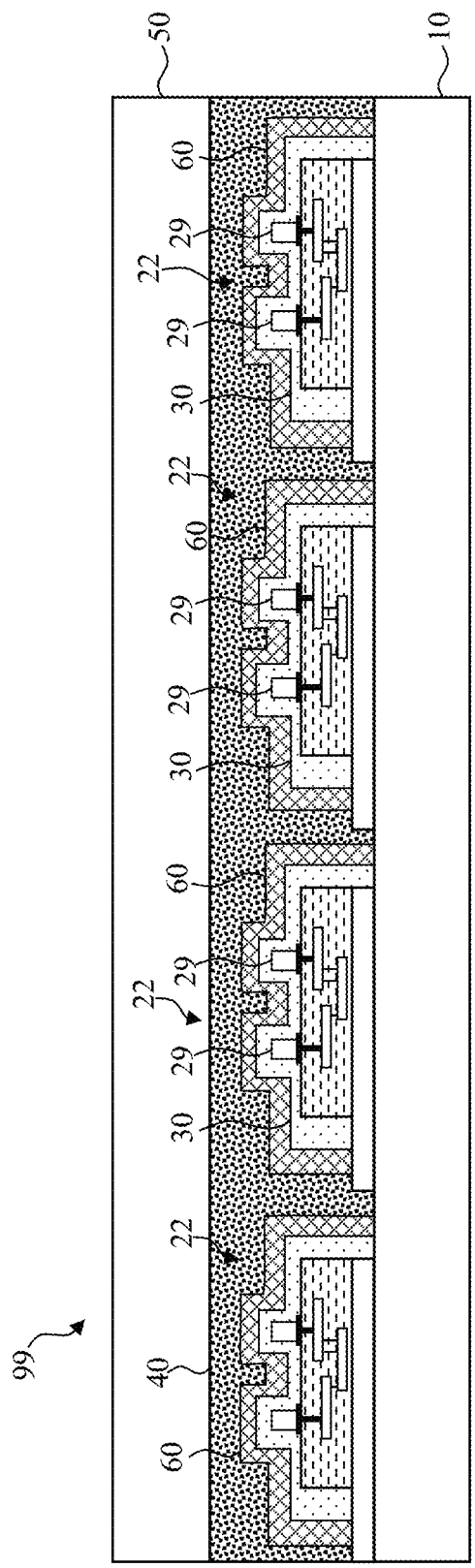
FIG. 11 is a cross section illustrating a completed semiconductor device according to illustrative embodiments of the present disclosure.

Referring in particular to FIGS. 10F-10I and to FIG. 11, in some embodiments of the present disclosure, a semiconductor structure 99 suitable for transfer printing (e.g., micro-transfer printing) comprises a handle substrate 50, a bonding layer 40 disposed in contact with the handle substrate 50, a capping layer 60 disposed in contact with the bonding layer 40, and a patterned release layer 30 disposed in contact with the capping layer 60, wherein a portion of the patterned release layer 30 is exposed, for example exposed to the atmosphere or, if the source substrate 10 is still present, a portion of the patterned release layer 30 is in contact with the source substrate 10 (e.g., such that the portion of the patterned release layer 30 will be exposed to the atmosphere when the source substrate 10 is removed). The illustration of FIG. 11 corresponds FIG. 10H in that a similar process of forming semiconductor structure 99 in accordance with FIG. 10A-10O can be used to form and print from the semiconductor structure 99 shown in FIG. 11. An exposed portion of a patterned release layer 30 can form an entry path 34 (as shown in FIG. 10H). A plurality of completed semiconductor devices 22 are disposed on or over a patterned release layer 30 and are each attached to at least one anchor 38 disposed on a handle substrate 50 (e.g. a portion of a bonding layer 40) with at least one tether 36. Each completed semiconductor device 22 comprises at least one electrical contact 25 on a side of the completed semiconductor device 22 between the completed semiconductor device 22 and a handle substrate 50. A connection post 29 is disposed on each electrical contact 25 and extends from the electrical contact 25 toward the handle substrate 50. The connection post 29 can have a sharp point. A patterned semiconductor support layer 21 comprises a surface 28 on which is disposed completed semiconductor devices 22 and the surface 28 is in contact with a portion of a patterned release layer 30.

In some embodiments of the present disclosure, a semiconductor structure 99 comprises a support substrate 10 in contact with a semiconductor support layer 21, for example as shown in FIG. 10G. In some embodiments, a support substrate 10 comprises a removal layer 26, for example as shown in FIG. 2A. In some such embodiments, a portion of a patterned release layer 30 is in contact with a support substrate 10, a layer on the support substrate 10, or a removal layer 26.

In some embodiments of the present disclosure and also as described above, a portion of a completed semiconductor device 22 or a semiconductor support layer 21 is a removal layer, or the semiconductor structure 99 comprises a removal layer in contact with the completed semiconductor device 22.

In some embodiments of the present disclosure, as shown in FIG. 10I and as discussed above (for example with respect to FIG. 1G), a patterned release layer 30 defines a gap 32 between completed semiconductor devices 22 and a bonding layer 40 or capping layer 60. In some embodiments, and as illustrated in FIGS. 6B-6D, each connection post 29 is tapered or the connection post 29 has a height to width aspect ratio of greater than 1:1, or both.

Figure 12:
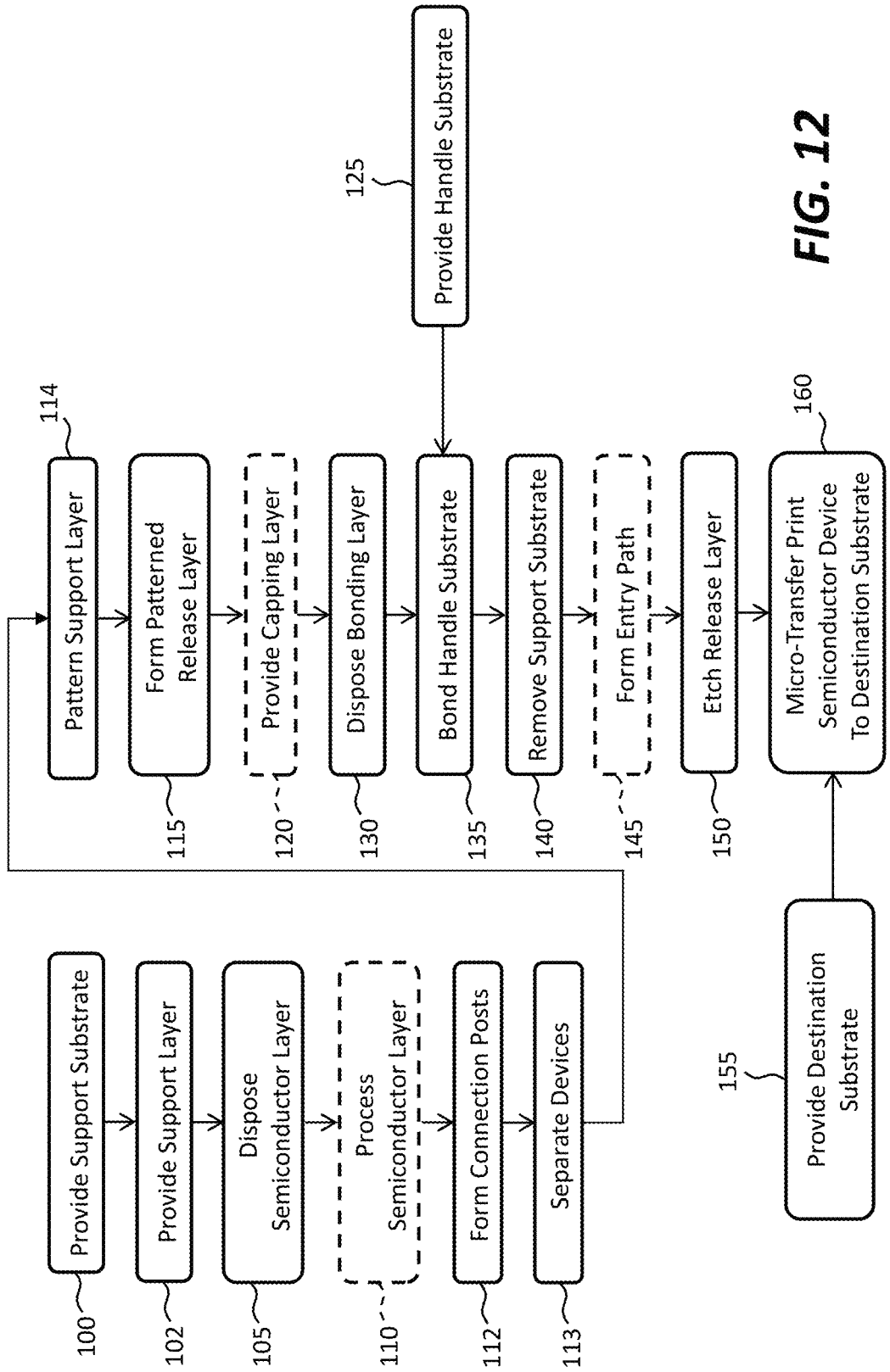
FIG. 12 is a flow chart illustrating exemplary methods, according to illustrative embodiments of the present disclosure.

Referring to FIGS. 10A-100 and also as described above with respect to FIGS. 1A-1J, 2A-2K, FIGS. 3A-3B, FIG. 4, and the flow chart of FIG. 12, a method of making a semiconductor structure 99 suitable for transfer printing, for example micro-transfer printing, comprises providing a support substrate 10 in step 100, providing a semiconductor support layer 21 over the support substrate 100 in step 102, providing a semiconductor layer 20 disposed over the semiconductor support layer 21 in step 105 (as shown in FIG. 10A), and optionally processing the semiconductor layer 20 in step 110 to form a plurality of semiconductor devices 23 disposed in, on, or over the semiconductor support layer 21, each of the semiconductor devices 23 having one or more electrical contacts 25 exposed on a side of the semiconductor device 23 opposite the semiconductor support layer 11 (as shown in FIG. 10B). A connection post 29 is formed on each of the exposed electrical contacts 25, the connection posts 29 extending in a direction away from the semiconductor support layer 10 in step 112 (as shown in FIG. 10C). The semiconductor layer 20 is processed, for example by pattern-wise etching, by exposure to a developer, or by exposure to oxygen plasma, to separate the semiconductor devices 23 and form a corresponding plurality of completed semiconductor devices 22 in step 113 (as shown in FIG. 10D). Similarly, the semiconductor support layer 21 is patterned, for example by pattern-wise etching, to expose a portion of the support substrate 10 in step 114 (FIG. 10E).

A patterned release layer 30 is formed on or over the completed semiconductor devices 22 in step 115 (FIG. 10F), the patterned release layer 30 (i) in contact with portions of the patterned semiconductor support layer 21 on which the complete semiconductor devices 22 are disposed and (ii) in contact with at least a portion of the support substrate 10. An optional capping layer 60 is provided in step 120 (as shown in FIG. 11) over the patterned release layer 30. Referring to FIGS. 10G and 10H, a handle substrate 50 is provided (step 125) and a conformable bonding layer 40 is disposed on the patterned release layer 30 or on the capping layer 60, if present, or on the handle substrate 50 in step 130 (as shown in FIG. 10G). The bonding layer 40 can be a curable bonding layer, for example a UV-curable or heat-curable resin or a metal or metal alloy layer that can be cured by heating the metal or metal alloy, disposing a structure in contact with the melted metal or metal alloy, and then cooling the metal. The handle substrate 50 is bonded to the patterned release layer 30 (or the capping layer 60, if present) with the bonding layer 40 in step 135 (as shown in FIG. 10H). In step 140, the support substrate 10 is removed to expose the patterned semiconductor support layer 21 where it was in contact with the support substrate 10 (as shown in FIG. 10I) or to expose completed semiconductor devices 22.

In some embodiments of the present disclosure, the optional capping layer has a suitable thickness so that the optional capping layer 60 disperses, deflects, reflects, or absorbs a shock wave produced by laser ablation of at least a portion of the support substrate or semiconductor support layer. For example, the optional capping layer 60 can have a thickness greater than the thickness of the patterned release layer 30. The optional capping layer 60 can have a thickness of about 40,000 Angstroms (e.g., between 30,000 Angstroms and 50,000 Angstroms). In some embodiments, the capping layer 60 is a stiffener or is also a stiffener that helps to protect the completed semiconductor devices 22 from mechanical stress during the removal of the support substrate 10 or during a micro-transfer print process.

If the patterned release layer 30 is not exposed, an entry path 34 can be formed, for example by pattern-wise etching. In some embodiments of the present disclosure, at least a portion of the patterned release layer 30 is removed in step 150, for example by etching, to form a gap 32 between at least a portion of the completed semiconductor devices 22 and at least a portion of the bonding layer 40 or capping layer 60, if present (as shown in FIG. 10J). The removal step 150 also forms a tether 36 physically connecting the completed semiconductor device 22 to an anchor 38 disposed on the handle substrate 50, for example a portion of the bonding layer 40. In some embodiments, the anchors 38 are disposed laterally between completed semiconductor devices 22 and each tether 36 extends laterally from a completed micro-device to an anchor 38. The tethers 36 can be in a common plane with the entry path 34. In some embodiments, each tether 36 is a portion of the semiconductor support layer 21.

Referring to FIG. 10K, in step 160, the completed semiconductor devices 22 are contacted with a stamp 80 and the stamp 80 is removed from the handle substrate 50 to adhere the completed semiconductor devices 22 to the stamp 80, thereby fracturing the tethers 36 to make a fractured tether 37 (as shown in FIG. 10L). The stamp 80 and completed semiconductor devices 22 are transported to a destination substrate 90 (provided in step 155) and the completed semiconductor devices 22 are contacted to the destination substrate 90 with the connection posts 29 electrically in contact with the contact pads 92 (as shown in FIG. 10M). The stamp 80 is then removed (as shown in FIG. 10N) leaving the completed semiconductor devices 22 micro-transfer printed from the handle substrate 50 onto the destination substrate (as shown in FIG. 10O).

In some embodiments of the present disclosure, the support substrate 10 is removed (step 140) by one or more of laser liftoff, ablation, laser ablation, etching, and grinding, for example a fluorine-based dry etch with an optional grind first. The semiconductor support layer 21 can be or comprise an ablation layer or a removal layer. An etch-stop layer can be disposed between the completed semiconductor device 22 and the support substrate 10. The support substrate 10 can comprise a removal layer, for example a layer for absorbing laser light to dissociate the support substrate 10 from the semiconductor support layer 21.

Materials of the various elements of the semiconductor structure 99 constructed using the method described in FIGS. 10A-100 can be the same as or similar to those described in FIG. 1A-1J or 2A-2K. The semiconductor support layer 21 can comprise a dielectric material that is differentially etchable from the support substrate 10 and can include patterned or unpatterned growth layers. For example, as with the support substrate 10, the semiconductor support layer 21 can comprise multiple layers, can include one or more semiconductor layers 20, can be a growth substrate, or can include a growth or semiconductor seed layer on which the one or more semiconductor layers 20 are formed or disposed. A semiconductor support layer 21 can be crystalline or have a crystalline layer. The handle substrate 50 can be a glass, ceramic, or semiconductor wafer, for example a silicon wafer.

Figure 13B:
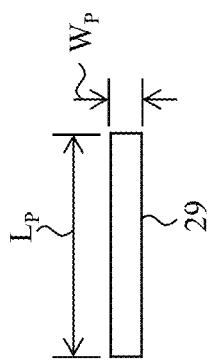
FIGS. 13A-13D are horizontal cross sections of connection posts according to illustrative embodiments of the present disclosure.
Figure 13D:
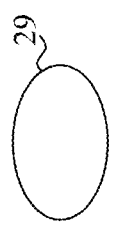
Figure 13A:
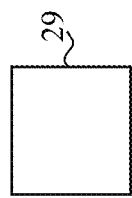
Figure 13C:
Figure 15B:
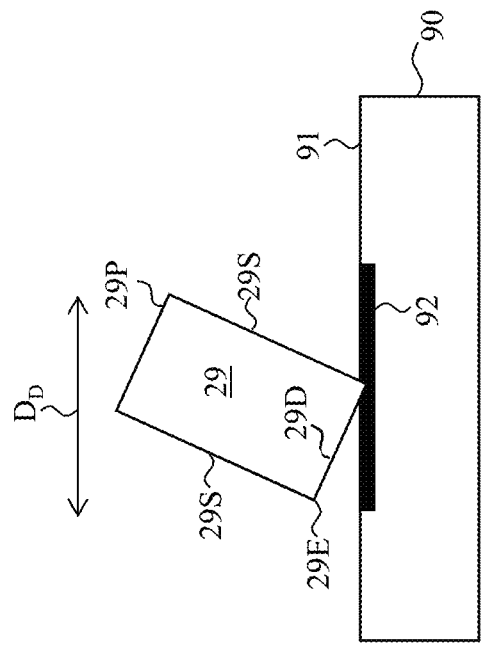
FIG. 15B is a corresponding partial detail cross section taken along cross section line A of FIG. 15A.

Referring to FIGS. 13A-13D, according to some embodiments of the present disclosure, a connection post 29 can have a square or rectangular horizontal cross section (as shown in FIG. 13A) or a rectangular horizontal cross section with an aspect ratio significantly different than one (as shown in FIG. 13B), for example a horizontal cross section with a post length $L_P$ much greater than a post width $W_P$ (e.g., having an aspect ratio of at least 2). A horizontal cross section can be in a plane substantially orthogonal to a direction in which connection post 29 extends. As shown in FIG. 13C, a connection post 29 can have a circular cross section or, as shown in FIG. 13D, a round (e.g., circular, ovate, or elliptical) cross section. More generally, connection post 29 can have any useful cross section for example square, rectangular, polygonal, circular, oval, or elliptical and can have straight or curved edges. In some embodiments, a connection post distal end 29D (see, for example, FIGS. 14A, 16, and 17) of a connection post 29 can have a flat distal surface 29D. A flat distal surface 29D can be, for example, orthogonal to a direction of the height or thickness of connection post 29 and can have a shape corresponding to any of connection posts 29 cross sections. A flat distal surface 29D need not be perfectly (e.g., atomically) flat but can be substantially flat or sufficiently flat to provide a sharp connection post edge 29E, for example as shown in FIG. 15B. A sharp connection post edge 29E can be a corner of a connection post 29. FIGS. 13A-13D can also be a bottom view of distal end 29D of connection post 29. The cross section or distal surface 29D of a connection post distal end 29D can be in a plane substantially parallel to a surface 28 of component 22 opposite a side 28 of component 22 from which connection post 29 extends (as shown in FIG. 14B).

Referring to FIGS. 14A and 14B, a connection post 29 can have a trapezoidal vertical cross section with a distal end 29D relatively remote from component 22 that has a distal surface with an area greater than an area of a proximal surface at a proximal end 29P of connection post 29 that is adjacent to component 22 (an inverted trapezoid). A vertical cross section can be in a plane substantially orthogonal to a surface of a destination substrate 90 on which component 22 is disposed and substantially parallel to a direction in which connection post 29 extends. FIG. 14B illustrates inverted trapezoidal connection posts 29 extending (e.g., protruding) from component 22 and spatially separated in a device direction $D_D$ along a length $L_D$ of component 22.

Figure 15A:
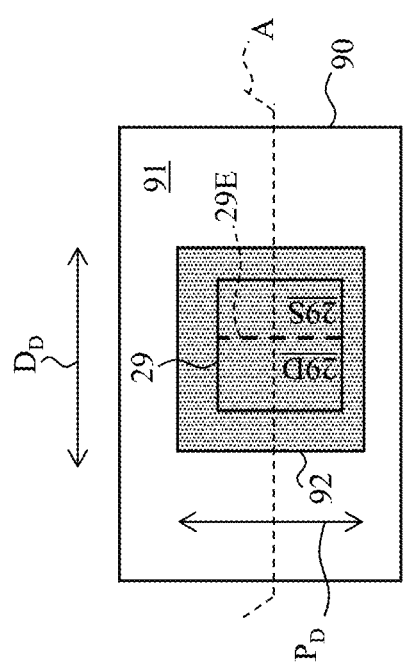
FIG. 15A is a plan view a of tilted connection post on a contact pad.
Figure 15C:
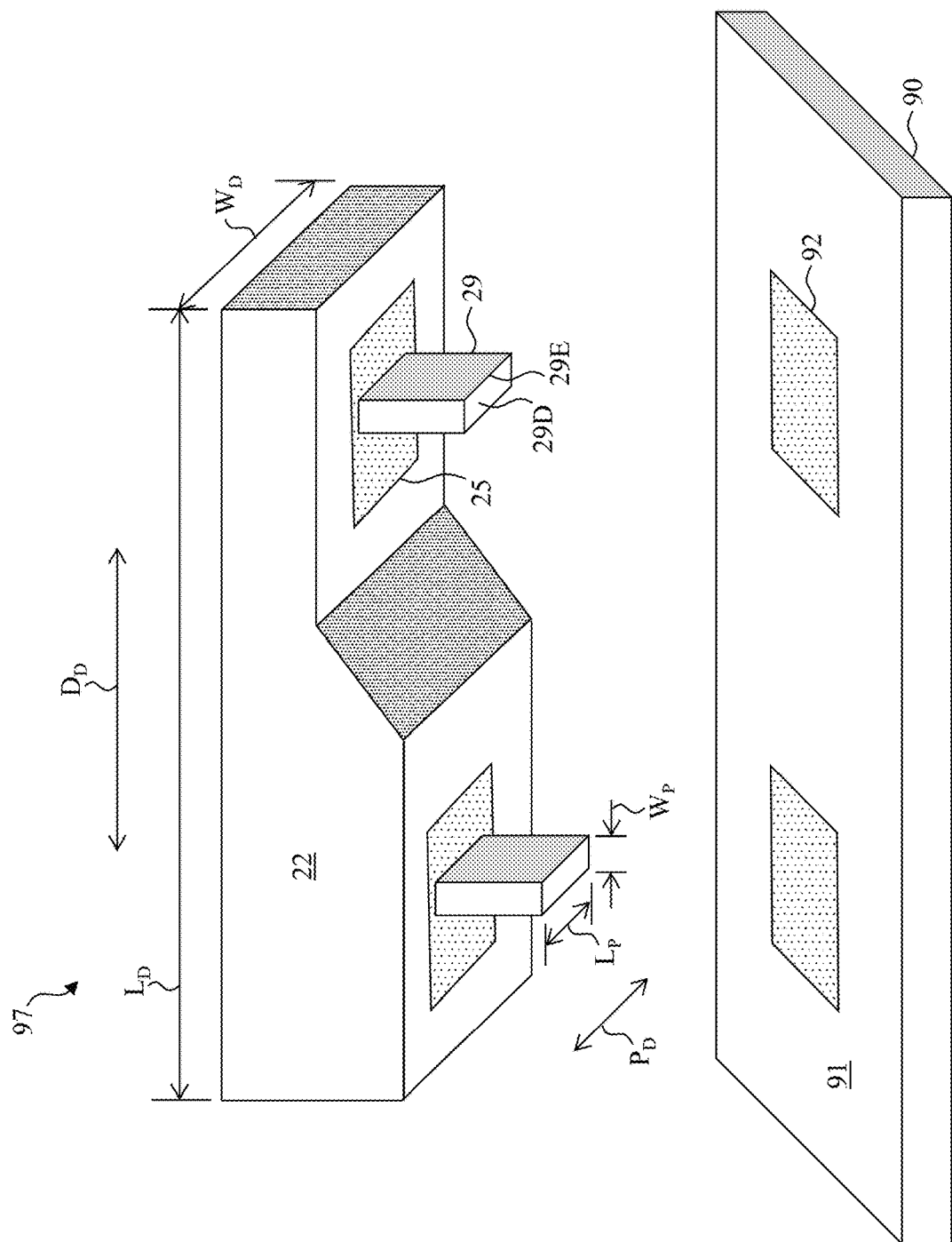
FIG. 15C is an exploded perspective of a component with connection posts according to illustrative embodiments of the present disclosure.

Referring to the top view of FIG. 15A, the partial cross section of FIG. 15B, and the exploded perspective of FIG. 15C, in some embodiments of the present disclosure, a printed semiconductor structure 98 comprises a destination substrate 90 comprising two or more contact pads 92 disposed on a surface 91 of destination substrate 90. A component 22 is disposed on surface 91 and optionally comprises two or more electrical contacts 92 disposed on a common side of component 22. Two or more connection posts 29 each extend from a common surface of component 29 and are each in electrical and physical contact with one of contact pads 92. If electrical contacts 92 are present, each connection post 29 can be electrically connected to at least one of electrical contacts 92. Component 22 is tilted (e.g., angled) with respect to surface 91 of destination substrate 90 so that at least one connection post 29 has a flat distal surface 29D that is tilted (e.g., at a non-zero angle) with respect to destination substrate 90 (and contact pad 92). A flat distal surface 29D that is tilted or disposed at an angle with respect to destination substrate 90 can be not parallel to surface 91 of destination substrate 90 or can be not parallel to a surface of contact pad 92.

In some embodiments, at least one connection post 29 has a connection post edge 29E, at least a portion of which is in electrical and physical contact with contact pad 92. In some embodiments, at least one connection post 29 has multiple connection post edges 29E (e.g., has a rectangular cross section), at least a portion of which are in electrical and physical contact with contact pads 92. In some embodiments, because component 22 is tilted with respect to destination substrate 90, distal end or distal surface 29D of connection post 29 is likewise tilted with respect to destination substrate 90 and contact pad 92 on surface 91 so that connection post edge 29E is closest to contact pad 92. Connection post edge 29E can be sharp, forming an acute or right angle between distal surface 29D of connection post 29 and connection post side 29S of connection post 29). Connection posts 29 with a flat distal surface 29D, when tilted, can pierce and/or embed into (e.g., deform) contact pad 92 to form a good electrical connection between connection post 29 and contact pad 92 (for example as shown in FIG. 15B) (e.g., as compared to non-tilted printing). For example, connection post edge 29E can pierce and/or embed into contact pad 92. Having one or more sharp connection post edges 29E for connection posts 29 can assist connection posts 29 in piercing and/or embedding into contact pad 92, thereby forming an improved electrical connection between connection post 29 and contact pad 92.

According to some embodiments of the present disclosure, distal surface 29D has a post length $L_P$ greater than a post width $W_P$, component 22 has a component length $L_D$ greater than a component width $W_D$, and a direction $D_D$ of component length $L_D$ is orthogonal to a direction of post length $L_P$ and parallel to a direction of post width $W_P$. Note that post length $L_D$ is not a distance from proximal end 29P to distal end 29D (the height) of connection post 29 but is instead the longest of the dimensions of distal surface 29D (e.g., a post length $L_P$ greater than a post width $W_P$). Such a configuration, as shown in FIG. 15C, provides a longer edge 29E to electrically connect to contact pads 92, thereby improving the electrical connection between connection post 29 and contact pad 92 and making it more physically robust. Longer connection post edges 29E provide greater regions of contact between connection posts 29 and contact pads 92. In some configurations, connection posts 29 can, but do not necessarily, have a common length $L_D$ or width $W_D$ and can be the same size or shape.

Figure 16:
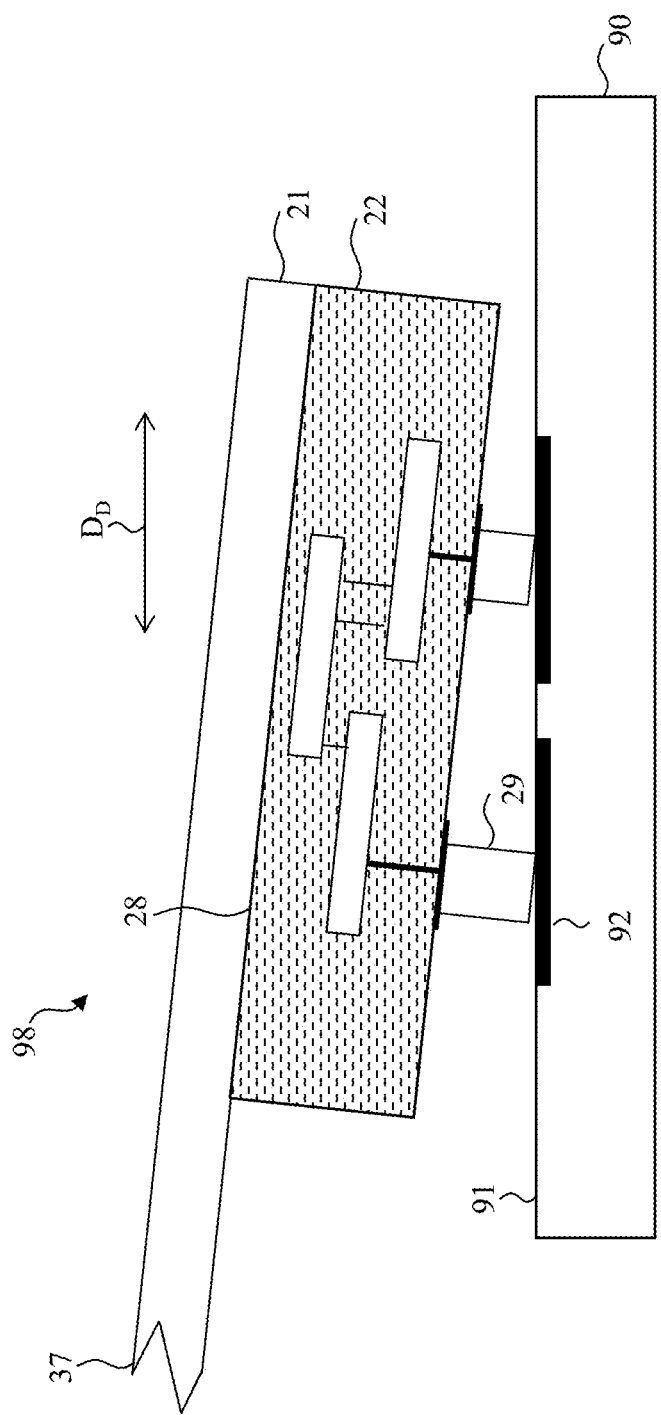
FIG. 16 is a cross section of a tilted component with connection posts having different lengths electrically connected to contact pads according to illustrative embodiments of the present disclosure.
Figure 17:
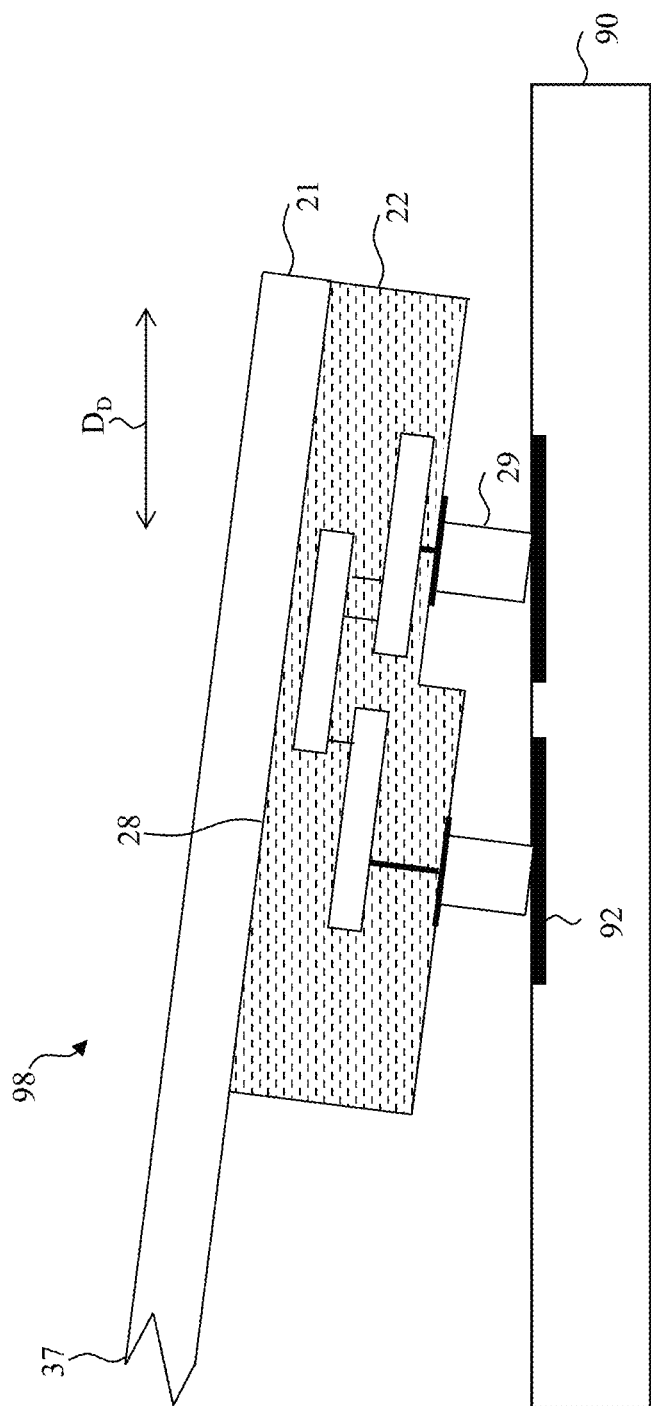
FIG. 17 is a cross section of a tilted component having a variable thickness with connection posts having a common length electrically connected to contact pads in different planes according to illustrative embodiments of the present disclosure.

In some embodiments, connection posts 29 can have a same, common height, as shown in FIGS. 6B, 6D, 8, 100, 14B, 15C, and 17 and electrical contacts 25 are in different planes with respect to component 22, semiconductor device 22 surface 28, or destination substrate surface 91 to provide a tilted (e.g., angled) component 22. In some embodiments, different connection posts 29 extend from different surfaces that are in different planes with respect to component 22, for example as shown in FIGS. 6C and 17, and, optionally have a common height, for example as also shown in FIG. 17. In some embodiments, connection posts 29 can have different heights, for example as shown in FIGS. 6C and 16. Component 22 can comprise a substantially planar side (e.g., surface 28) opposite the common side and substantially planar side 28 is tilted with respect to (i.e., is not parallel to) surface 91 of destination substrate 90.

Figure 18A:
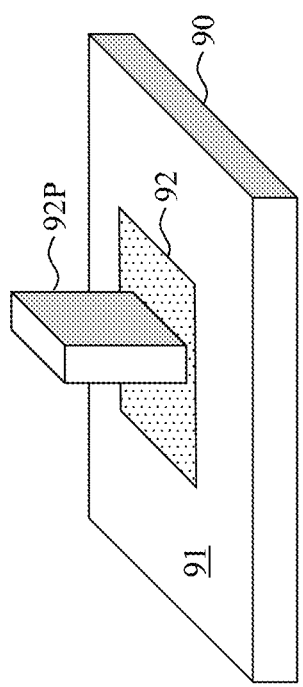
FIG. 18A is a perspective of a contact pad post according to illustrative embodiments of the present disclosure.
Figure 18B:
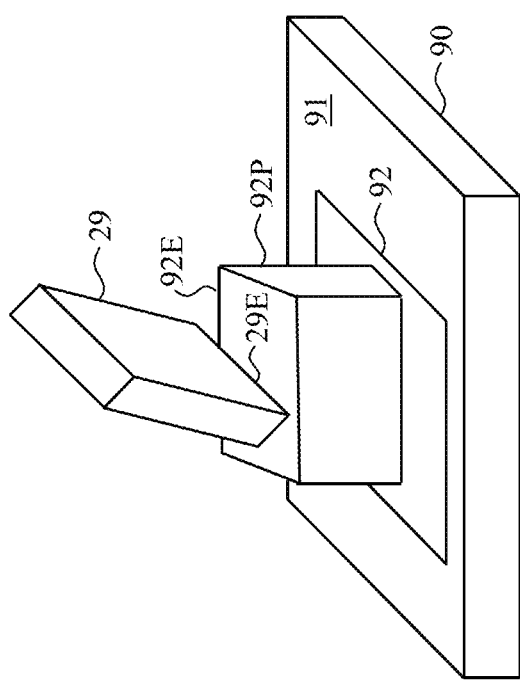
FIG. 18B is a perspective of a tilted contact pad post in contact with a tilted connection post according to illustrative embodiments of the present disclosure.

Referring to FIG. 18A, according to some embodiments, a contact pad 92 on a destination substrate 90 can comprise a contact pad post 92P that extends (e.g., protrudes) from surface 91 of destination substrate 90. Component 22 with connection post 29 can be printed onto contact pad post 92P to form an electrical connection. Referring to FIG. 18B, contact pad post 92P can have a tilted (e.g., angled) distal surface (e.g., a flat titled surface) with a contact pad post edge 92E that contacts connection post edge 29E at an angle (e.g., a substantially orthogonal angle), so that electrical contact is made substantially at a point. By substantially it is meant a contact that has an extent smaller than an extent of connection post 29 or an extent of contact pad post 92P.

In some embodiments of the present disclosure, component 22 can comprise a broken (e.g., fractured) or separated tether 37. Component 22 can have at least one of a width, a length, and a height from 2 to 100 μm (e.g., 2 to 5 μm, 5 to 10 μm, 10 to 20 μm, 20 to 50 μm, or 50 to 100 μm).

Connection posts 29 (i) can be tapered, (ii) can have a height-to-width aspect ratio of greater than 1:1 or less than 1:1, or any combination of (i) and (ii). At least one of connection posts 29 can extend from an electrical contact 25 of two or more electrical contacts 25. In some embodiments and as shown in FIGS. 6A-6F, component 22 comprises an electrically separate electrode 27 electrically connected to at least one of electrical contacts 25 and at least one of connection posts 29 extends from electrode 27.

According to some embodiments of the present disclosure, a printed semiconductor structure 98 can comprise a plurality of components 22 disposed on surface 91, wherein each component 22 of the plurality of components 22 is tilted (e.g., angled) with respect to surface 91, and optionally comprises two or more electrical contacts 25 disposed on a common side of component 22. A connection post 29 extends from each component 22, e.g., from an electrical contact 25 or electrode 27. Each connection post 29 is in electrical contact with a contact pad 92 and at least one connection post 29 has a flat distal surface 29D.

According to some embodiments of the present disclosure and as shown in FIG. 15C, a semiconductor structure 97 comprises a component 22. Two or more connection posts 29 disposed on a common side of component 22 each (i) extend from component 22 and (ii) at least one connection post 29 has a flat distal surface 29D. Distal surface 29 has a post length $L_P$ greater than a post width $W_P$, component 22 has a device length $L_D$ greater than a device width $W_D$, and a device direction $D_D$ of device length $L_D$ is orthogonal to a direction of post length $L_P$. Component 22 can comprise two or more electrical contacts 25 disposed on the common side of component 22 and each of the connection posts 29 can electrically connect to at least one electrical contact 25. Component 22 can comprise a broken (e.g., fractured) or separated tether 37. One or more connection posts 29 can have different heights or a common height in different planes with respect to component 22 or surface 28. Distal surface 29D can have a greater area than proximal surface 29P. Such a semiconductor structure 97 can provide a more robust and improved electrical connection to a contact pad 92 when transfer printed (e.g., micro-transfer printed) to a destination substrate 90 on which contact pads 92 are disposed by contacting one or more (e.g., sharp) edges 29E of connection post 29 to contact pad 92, enabling connection post 29 to more readily pierce and/or embed into contact pad 92.

Component 22 can be, for example, a light-emitting device, a light-emitting diode, a laser, or a laser diode and can have at least one of a width, a length, and a height from 2 to 100 μm (e.g., from 2 to 5 μm, 5 to 10 μm, 10 to 20 μm, 20 to 50 μm, or 50 to 100 μm).

Certain embodiments of the present disclosure provide, inter alia, methods and structures for making micro-transfer printable structures on a handle (or carrier) substrate using fewer process steps, with fewer layers, or with fewer process chemicals, and with less-stringent resolution requirements. Micro-transfer printable components 22 made by methods in accordance with some embodiments of the present disclosure can include one or more of a variety of semiconductor structures, including (for example, but not limited to) a diode, a light-emitting diode (LED), a laser (e.g., a diode laser), a photo-diode (e.g., solar cell), a photo-transistor, a transistor, a sensor, or an integrated circuit.

In some embodiments of the present disclosure, components 22 (e.g., completed semiconductor devices 22) have a length greater than a width, for example having an aspect ratio greater than or equal to 2, 4, 8, 10, 20, or 50, and electrical contacts 25 that are adjacent to the ends of the components 22 along the length of the components 22. Components 22 can have a variety of different sizes. For example, in some embodiments, components 22 have at least one of a width from 2 to 100 μm (e.g., 2 to 5 μm, 5 to 10 μm, 10 to 20 μm, 20 to 50 μm, or 50 to 100 μm), a length from 2 to 100 μm (e.g., 2 to 5 μm, 5 to 10 μm, 10 to 20 μm, 20 to 50 μm, or 50 to 100 μm), and a height from 2 to 100 μm (e.g., 2 to 5 μm, 5 to 10 μm, 10 to 20 μm, 20 to 50 μm, or 50 to 100 μm).

Components 22, including connection posts 29, can be printed at a non-zero angle with respect to a surface 91 of a destination substrate 90 to which components 22 are printed (for example tilted), for example, using a process similar to that shown in FIGS. 10A-0 with transfer device 80 (stamp 80 in the case of FIGS. 10A-O). To achieve the desired tilt (and differing from exactly what is shown in FIGS. 10A-O), connection posts 29 can have different heights or can extend from surfaces on a common side of component 22 that are disposed in different planes with respect to component 22, for example. In some embodiments, component 22 is oriented substantially parallel to destination substrate 90 as component 22 is brought into contact with destination substrate 90. Then, due to the particular structure of component 22, including its connection posts 29, component 22 is tilted prior separation of transfer device 80 from component 22, for example as a result of the pressure applied by transfer device 80. In some embodiments, component 22 comprising two or more electrically conductive connection posts 29 extending from a common side of component 22 is provided. Component 22 can be provided on a transfer device 80 and each of the connection posts 29 can have a flat distal surface 29D. Destination substrate 90 comprising two or more contact pads 92 disposed on or in a surface 91 of destination substrate 90 is also provided. Component 22 can then be printed from transfer device 80 to surface 91 of destination substrate 90 such that component 22 is tilted relative to destination substrate 90 after the printing. In some embodiments, the distal end 29D of each connection post 29 of component 22 is substantially parallel to a surface of destination substrate 90 as transfer device 80 brings component 22 into contact with destination substrate 90. In some embodiments, component 22 is tilted with respect to destination substrate 90 after transfer device 80 is separated from component 22.

Components 22 can be any printable structure, for example including any one or more of a wide variety of active or passive (or active and passive) components 22. Components 22 can be, for example, any one or more of integrated devices, integrated circuits (such as CMOS circuits), light-emitting diodes, photodiodes, sensors, electrical or electronic devices, optical devices, opto-electronic devices, magnetic devices, magneto-optic devices, magneto-electronic devices, and piezo-electric devices, materials or structures. Components 22 can comprise electronic component circuits that operate component 22. Components 22 can be responsive to electrical energy, to optical energy, to electromagnetic energy, or to mechanical energy, for example. Components 22 can include one or more of metallic materials, insulating materials, and semiconducting materials. In some embodiments, a component 22 is a completed semiconductor device 22. A component 22 can be or include, for example, a capacitor, a transistor or an electrical jumper. In some embodiments, a component 22 comprises an intermediate substrate from which connection posts 29 extend and one or more devices (e.g., light emitters, controllers, or other passive and/or active devices) disposed on the intermediate substrate. In some embodiments, the one or more devices are printed devices (e.g., micro-transfer printed devices) that have been printed on the intermediate substrate.

Certain embodiments were described herein with reference to a completed semiconductor device 22; analogous embodiments using a component 22 that is not a completed semiconductor device 22 in place of completed semiconductor device 22 are also contemplated.

Reference is made throughout the present description to examples of micro-transfer printing with stamp 80 when describing certain examples of printing components 22. Methods may have been variously described as transferring components 22, printing components 22, or micro-transferring components 22. Micro-transfer-printing involves using a transfer device 80 (e.g., an elastomeric stamp 80, such as a PDMS stamp 80) to transfer a component 22 using controlled adhesion. For example, an exemplary transfer device can use kinetic or shear-assisted control of adhesion between a transfer device 80 and a component 22.

It is contemplated that, in certain embodiments, where a method is described as including micro-transfer-printing a component 30, other analogous embodiments exist using a different transfer method. As used herein, printing a component 22 (e.g., to a destination substrate 90) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to print a component 22. Where an example was detailed above as using a stamp 80 to print component(s) 22, embodiments are expressly contemplated where a transfer device 80 that is not a stamp 80 is used to similarly print components 22. For example, in some embodiments, a transfer device 80 that is a vacuum-based or electrostatic transfer device 80 can be used to print components 22. A vacuum-based or electrostatic transfer device 80 can comprise a plurality of transfer posts, each transfer post being constructed and arranged to pick up a single component 22 (similarly to stamp pillars 82 in stamp 80).

Methods of forming micro-transfer printable structures are described, for example, in the paper "AMOLED Displays using Transfer-Printed Integrated Circuits" (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, the disclosure of each of which is hereby incorporated by reference in its entirety. Micro-transfer printing using compound micro-assembly structures and methods can also be used with certain embodiments of the present disclosure, for example, as described in U.S. patent application Ser. No. 14/822,868, filed Aug. 10, 2015, entitled "Compound Micro-Assembly Strategies and Devices", the disclosure of which is hereby incorporated by reference in its entirety. Additional details useful in understanding and performing aspects of certain embodiments of the present disclosure are described in U.S. patent application Ser. No. 14/743,981, filed Jun. 18, 2015, entitled "Micro Assembled LED Displays and Lighting Elements", the disclosure of which is hereby incorporated by reference in its entirety.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions can be conducted simultaneously in some circumstances. The invention has been described in detail with particular reference to certain embodiments thereof, but it will be understood that variations and modifications can be effected within the spirit and scope of the invention.

PARTS LIST

A cross section line
$D_D$ device direction
$D_S$ thickness/dimension
$D_L$ thickness/dimension
$L_D$ device length
$L_P$ post length P_D post direction
W_D device width
W_P post width
10 support substrate
20 semiconductor layer
21 semiconductor support layer
22 completed semiconductor device/component
23 semiconductor device
24 dielectric layer
25 electrical contact
26 removal layer
27, 27A, 27B electrode
28 surface/planar side
29 connection post
29D connection post distal end/distal surface
29E connection post edge
29P proximal connection post end/proximal surface
29S connection post side
30 release layer
32 gap
34 entry path
36 tether
37 fractured tether
38 anchor
39 anchor structure
40 bonding layer
42 bonding layer planar side
44 non-planar bonding layer opposite side
50 handle substrate
60 capping layer
70 electromagnetic radiation
80 transfer device/stamp
82 stamp pillar
90 destination substrate
91 surface
92 contact pad
92P contact pad post
92E contact pad post edge
97 semiconductor structure
98 printed semiconductor structure
99 semiconductor structure
100 provide support substrate step
102 provide support layer
105 dispose semiconductor layer step
110 optional process semiconductor layer step
112 form connection posts
113 separate semiconductor devices
114 pattern semiconductor support layer
115 form patterned release layer step
120 optional provide capping layer step
125 provide handle substrate step
130 dispose bonding layer step
135 bond handle substrate step
140 remove support substrate step
145 optional form entry path step
150 etch release layer step
155 provide destination substrate step
160 micro-transfer print semiconductor device to destination substrate step

What is claimed:

1. A printed structure, comprising:
a destination substrate comprising two or more contact pads disposed on or in a surface of the destination substrate;
a component disposed on the surface; and
two or more electrically conductive connection posts, each of the connection posts (i) is formed on and extending from a common side of the component, (ii) being in electrical and physical contact with one of the contact pads, and (iii) is in direct physical contact with and pierces or is embedded in the one of the contact pads,
wherein the component is tilted with respect to the surface of the destination substrate, and
wherein each of the connection posts has a flat distal surface, and
wherein ones of the connection posts extend from different surfaces on the common side, the different surfaces being disposed in different planes with respect to the component.

2. The printed structure of claim 1, wherein each of the connection posts has one or more sharp edges and at least a portion of the one or more sharp edges is in electrical and physical contact with and pierces or is embedded in the one of the contact pads.

3. The printed structure of claim 1, wherein each of the connection posts has a post length greater than a post width, the component has a component length greater than a component width, and a direction of the component length is orthogonal to a direction of the post length.

4. The printed structure of claim 1, wherein the connection posts have a common height.

5. The printed structure of claim 1, wherein the component comprises a substantially planar side opposite the common side and the substantially planar side is not parallel to the surface of the destination substrate.

6. The printed structure of claim 1, wherein the component comprises a broken or separated tether.

7. The printed structure of claim 1, wherein each of the connection posts has an inverted trapezoidal vertical cross section.

8. The printed structure of claim 1, wherein the connection posts have different heights.

9. The printed structure of claim 1, wherein the connection posts (i) are tapered, (ii) have a height-to-width aspect ratio of greater than 1:1, or both (i) and (ii).

10. The printed structure of claim 1, wherein the component has at least one of a width, a length, and a height from 2 to 100 μm.

11. The printed structure of claim 1, comprising:
a plurality of components disposed on the surface, wherein each component of the plurality of components is tilted with respect to the surface; and
respective connection posts extending from each of the plurality of components, wherein each of the respective connection posts has a flat distal surface and is in electrical and physical contact with one of the contact pads.

12. The printed structure of claim 1, wherein the component comprises two or more electrical contacts disposed on the common side of the component, wherein the connection posts are each electrically connected to at least one of the electrical contacts.

13. The printed structure of claim 12, wherein at least one of the connection posts extends from an electrical contact of the two or more electrical contacts.

14. The printed structure of claim 12, wherein the component comprises an electrically separate electrode electrically connected to at least one of the electrical contacts and at least one of the connection posts extends from the electrode.

15. The printed structure of claim 1, wherein the component is a completed semiconductor device.

16. The printed structure of claim 1, wherein each of the connection posts pierces, is embedded in, or both pierces and is embedded in the one of the contact pads.

17. The printed structure of claim 1, wherein each of the connection posts has a round or rectangular cross section.

18. The printed structure of claim 1, wherein each of the connection posts has a rectangular cross section with an aspect ratio of at least 2.

19. The printed structure of claim 1, wherein each of the connection posts has an inverted trapezoidal vertical cross section.

20. The printed structure of claim 1, wherein the one of the contact pads comprises a contact pad post and each of the connection posts contacts the contact pad post of the one of the contact pads substantially at a point.

* * * * *